US012740112B2

(12) United States Patent
Chen et al.

(10) Patent No.: US 12,740,112 B2
(45) Date of Patent: Sep. 15, 2026

(54) ONE TIME PROGRAMMING MEMORY INCLUDING FORKSHEET TRANSISTORS AND USING PHYSICALLY UNCLONABLE FUNCTION TECHNOLOGY

(71) Applicant: eMemory Technology Inc., Hsin-Chu (TW)

(72) Inventors: Lun-Chun Chen, Hsinchu County (TW); Ping-Lung Ho, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 348 days.

(21) Appl. No.: 18/660,626

(22) Filed: May 10, 2024

(65) Prior Publication Data

US 2024/0395863 A1 Nov. 28, 2024

Related U.S. Application Data

(60) Provisional application No. 63/526,481, filed on Jul. 13, 2023, provisional application No. 63/468,561, filed on May 24, 2023.

(51) Int. Cl.
*H10D 62/10* (2025.01)
*G11C 17/18* (2006.01)
(Continued)

(52) U.S. Cl.
CPC ........... *H10D 62/121* (2025.01); *G11C 17/18* (2013.01); *H10B 20/25* (2023.02); *H10D 30/43* (2025.01);
(Continued)

(58) Field of Classification Search
CPC .. H10D 62/121; H10D 30/43; H10D 30/6729; H10D 30/6735; H10D 30/6757;
(Continued)

(56) References Cited

U.S. PATENT DOCUMENTS 9,613,714 B1 4/2017 Wong
11,830,827 B2 * 11/2023 Chang .................... G06F 21/44
(Continued)

FOREIGN PATENT DOCUMENTS

CA 2952941 A1 7/2017
EP 3196888 B1 12/2019

*Primary Examiner* — Allison Bernstein
(74) *Attorney, Agent, or Firm* — WPAT, PC

(57) ABSTRACT

An OTP memory using a PUF technology includes a first memory cell. The first memory cell includes an antifuse transistor, a first select transistor and a second select transistor. The antifuse transistor includes a first nanowire, a second nanowire, a first gate structure, a first drain/source structure and a second drain/source structure. The first portions of the first nanowire and the second nanowire are contacted with the isolation wall. The second portions of the first nanowire and the second nanowire are covered by the first gate structure. The first drain/source structure is electrically connected with the first terminals of the first nanowire and the second nanowire. The second drain/source structure is electrically connected with a second terminal of the second nanowire, but not electrically connected with a second terminal of the first nanowire.

19 Claims, 9 Drawing Sheets

(51) Int. Cl.

| | |
|---|---|
| ***H10B 20/25*** | (2023.01) |
| ***H10D 30/43*** | (2025.01) |
| ***H10D 30/67*** | (2025.01) |
| ***H10D 84/85*** | (2025.01) |

(52) U.S. Cl.
CPC ..... *H10D 30/6729* (2025.01); *H10D 30/6735* (2025.01); *H10D 30/6757* (2025.01); *H10D 84/85* (2025.01)

(58) Field of Classification Search
CPC ........ H10D 84/85; G11C 17/18; G11C 17/16; H10B 20/25; H10W 42/405
See application file for complete search history.

(56) References Cited

U.S. PATENT DOCUMENTS

| | | | | |
|---|---|---|---|---|
| 12,414,293 | B2 * | 9/2025 | Chen | G11C 17/16 |
| 2021/0407999 | A1 | 12/2021 | Huang | |
| 2024/0023328 | A1 * | 1/2024 | Chen | G11C 16/24 |
| 2025/0063728 | A1 * | 2/2025 | Chen | H10B 20/25 |

* cited by examiner

Cell2
Cell1
BL3
BL1
BL4
BL2
WL1
WL2
AF
MS3
MS1
MAF2
MAF1
MS4
MS2
d1
d2
257
212
207
248
292
249
293
247
242
243
255
205
238
282
239
283
237
232
233
253
203
228
272
229
273
227
222
223
251
201

Cell1
BL1
207
248
WL1
243
242
240
241
210
249
247
205
238
AF
233
232
230
231
239
237
203
sub
228
WL2
223
222
220
221
229
227
BL2
201

Cell1

(0V) BL1
IENRL
207
248
(VON) WL1
249
247
243
240
210
MS1
205
AF (VENRL)
238
239
237
233
232
230
231
MAF1
203
(VOFF)
WL2
228
229
227
223
222
220
221
sub
MS2
(0V) BL2
201
Cell1

(0V) BL1
IENRL
207
248
(VON) WL1
249
247
243
240
210
MS1
205
AF (VENRL)
238
239
237
233
230
231
232
MAF1
203
(VOFF)
WL2
228
229
227
223
222
220
221
sub
MS2
(0V) BL2
201

Cell1
(0V) BL1
207
248
(VOFF) WL1
243
240
249
247
210
MS1
205
AF (VRD)
238
233
232
230
231
239
237
MAF1
203
221
WL2 (VON)
228
223
222
220
229
227
sub
MS2
(0V) BL2
IRD
201

Cell1
IENRL
(0V) BL1
207
248
(VOFF) WL1
243
240
249
247
210
MS1
205
AF (VRD)
238
232
233
230
231
239
237
MAF1
203
WL2 (VON)
228
223
222
220
221
229
227
sub
MS2
(0V) BL2
IRD=0
201

Cell1
Cell2
BL1
BL2
BL3
BL4
WL1
WL2
FL1
FL2
AF
MS1
MS2
MS3
MS4
MF1
MF2
MF3
MF4
MAF1
MAF2
e1
e2
sub Cell1
(0V) BL2
WL2 (VOFF)
AF2 (VRD)
(VRD) AF1
(VON) WL1
BL1 (0V)
IRD1
527 529 528
537 539 538
547 549 548
647 649 648
523
522
520
521
533
532
530
531
543
542
540
541
643
640
501
503
505
507
509
510
sub
MS2
MAF2
MAF1
MS1

Cell1
(0V)BL2
WL2 (VOFF)
AF2 (VRD)
(VRD) AF1
(VON) WL1
BL1 (0V)
IRD1=0
642
641

ONE TIME PROGRAMMING MEMORY INCLUDING FORKSHEET TRANSISTORS AND USING PHYSICALLY UNCLONABLE FUNCTION TECHNOLOGY

This application claims the benefit of U.S. provisional application Ser. No. 63/468,561, filed May 24, 2023, and U.S. provisional application Ser. No. 63/526,481, filed Jul. 13, 2023, the subject matters of which are incorporated herein by references.

FIELD OF THE INVENTION

The present invention relates to a non-volatile memory, and more particularly to a one time programming memory cell (OTP memory cell) with forksheet transistors by using a physically unclonable function (PUF) technology.

BACKGROUND OF THE INVENTION

As is well known, a one time programming memory (also referred as an OTP memory) is one of the non-volatile memories. The OTP memory comprises plural one time programming memory cells (also referred as OTP memory cells). The OTP memory cell can be programmed once. After the OTP memory cell is programmed, the stored data fails to be modified.

A physically unclonable function (PUF) technology is a novel method for protecting the data of a semiconductor chip. That is, the use of the PUF technology can prevent the data of the semiconductor chip from being stolen. In accordance with the PUF technology, the semiconductor chip is capable of providing a random code. This random code is used as a unique identity code (ID code) of the semiconductor chip to achieve the protecting function.

Generally, the PUF technology acquires the unique random code of the semiconductor chip according to the manufacturing variation of the semiconductor chip. This manufacturing variation includes the semiconductor process variation. That is, even if the PUF semiconductor chip is produced by a precise manufacturing process, the random code cannot be duplicated. Consequently, the semiconductor chip using the PUF technology is suitably used in the applications with high security requirements.

For example, U.S. Pat. No. 9,613,714 disclosed a one time programming memory cell and a memory array for a PUF technology and an associated random code generating method.

SUMMARY OF THE INVENTION

An embodiment of the present invention provides a one time programming memory using a physically unclonable function technology. The one time programming memory includes a first memory cell and a second memory cell. The first memory cell and the second memory cell are respectively located beside a first side and a second side of an isolation wall. The first memory cell includes a first nanowire, a second nanowire, a first gate structure, a first drain/source structure, a second drain/source structure, a first select transistor, and a second select transistor. A first-portion surface of the first nanowire is contacted with the isolation wall. A first-portion surface of the second nanowire is contacted with the isolation wall. The first gate structure includes a first gate dielectric layer, a second gate dielectric layer, a first gate layer, a first spacer and a second spacer. A central region of a second-portion surface of the first nanowire is covered by the first gate dielectric layer. A central region of a second-portion surface of the second nanowire is covered by the second gate dielectric layer. A first side region of the second-portion surface of the first nanowire is contacted with the first spacer. A second side region of the second-portion surface of the first nanowire is contacted with the second spacer. A first side region of the second-portion surface of the second nanowire is contacted with the first spacer. A second side region of the second-portion surface of the second nanowire is contacted with the second spacer. The first gate dielectric layer and the second gate dielectric layer are covered by the first gate layer. The first gate layer is connected with an antifuse line. The first drain/source structure is electrically connected with a first terminal of the first nanowire and a first terminal of the second nanowire. The second drain/source structure is electrically connected with a second terminal of the second nanowire. The second drain/source structure is not electrically connected with a second terminal of the first nanowire. A first drain/source terminal of the first select transistor is coupled to the first drain/source structure. A gate terminal of the first select transistor is connected with a first word line. A second drain/source terminal of the first select transistor is connected with a first bit line. A first drain/source terminal of the second select transistor is coupled to the second drain/source structure. A gate terminal of the second select transistor is connected with a second word line. A second drain/source terminal of the second select transistor is connected with a second bit line. The first nanowire, the second nanowire, the first gate structure, the first drain/source structure and the second drain/source structure are collaboratively formed as a first antifuse transistor. A region between the antifuse line and the first bit line is an enroll path. The first nanowire and the second nanowire are included in the enroll path. A region between the antifuse line and the second bit line is a read path. The second nanowire is included in the read path. The first nanowire is not included in the read path. When an enroll action is performed, the enroll path is turned on. Consequently, one of the first gate dielectric layer and the second gate dielectric layer in the first antifuse transistor is ruptured. When a read action is performed, the read path is turned on. A one-bit random code is determined according to the ruptured one of the first gate dielectric layer and the second gate dielectric layer in the first antifuse transistor.

Another embodiment of the present invention provides a one time programming memory using a physically unclonable function technology. The one time programming memory includes a first memory cell and a second memory cell. The first memory cell and the second memory cell are respectively located beside a first side and a second side of an isolation wall. The first memory cell includes a first nanowire, a first gate structure, a second nanowire, a second gate structure, a first drain/source structure, a second drain/source structure, a third drain/source structure, a first select transistor and a second select transistor. A first-portion surface of the first nanowire is contacted with the isolation wall. The first gate structure includes a first gate dielectric layer, a first gate layer, a first spacer and a second spacer. A central region of a second-portion surface of the first nanowire is covered by the first gate dielectric layer. A first side region of the second-portion surface of the first nanowire is contacted with the first spacer. A second side region of the second-portion surface of the first nanowire is contacted with the second spacer. The first gate dielectric layer is covered by the first gate layer. The first gate layer is connected with a first antifuse line. A first-portion surface of the second nanowire is contacted with the isolation wall. The second gate structure includes a second gate dielectric layer, a second gate layer, a third spacer and a fourth spacer. A central region of a second-portion surface of the second nanowire is covered by the second gate dielectric layer. A first side region of the second-portion surface of the second nanowire is contacted with the third spacer. A second side region of the second-portion surface of the second nanowire is contacted with the fourth spacer. The second gate dielectric layer is covered by the second gate layer. The second gate layer is connected with a second antifuse line. The first drain/source structure is electrically connected with a first terminal of the first nanowire. The second drain/source structure is electrically connected with a second terminal of the first nanowire and a first terminal of the second nanowire. The third drain/source structure is electrically connected with a second terminal of the second nanowire. A first drain/source terminal of the first select transistor is coupled to the first drain/source structure. A gate terminal of the first select transistor is connected with a first word line. A second drain/source terminal of the first select transistor is connected with a first bit line. A first drain/source terminal of the second select transistor is coupled to the third drain/source structure. A gate terminal of the second select transistor is connected with a second word line. A second drain/source terminal of the second select transistor is connected with a second bit line. The first nanowire, the first gate structure, the first drain/source structure and the second drain/source structure are collaboratively formed as a first antifuse transistor. The second nanowire, the second gate structure, the second drain/source structure and the third drain/source structure are collaboratively formed as a second antifuse transistor. When an enroll action is performed, a region between the first antifuse line and the first bit line is a first enroll path, and a region between the second antifuse line and the second bit line is a second enroll path. When an enroll action is performed, the first enroll path and the second enroll path are turned on, so that one of the first gate dielectric layer and the second gate dielectric layer is ruptured. When a read action is performed, the region between the first antifuse line and the first bit line is a first read path, and the region between the second antifuse line and the second bit line is a second read path. The read action is performed, a one-bit random code is determined.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As used herein, the term "ruptured" may be referred to as "quantum-tunneling" technique. In detail, after energy accumulated on the gate terminals of a forksheet transistor reaches a certain level, quantum-tunneling may occur on the forksheet transistor. The energy accumulated on the gate terminals of the forksheet transistor will be released via a gate leakage path of which undergoing quantum-tunneling. Thus, forksheet transistors would generate a quantum-tunneling current higher than a predetermined threshold value. The mechanism of quantum-tunneling mentioned above may be similar to a gate oxide breakdown, but is not limited to a hard/destructive breakdown. For example, the quantum-tunneling may be a soft breakdown that leverages trap-assisted tunneling, but the present invention is not limited thereto. For better comprehension, the forksheet transistor which generates a quantum-tunneling current higher than the predetermined threshold value may be referred to as being "ruptured", and the forksheet transistor which generates a quantum-tunneling current lower than the predetermined threshold value (or does not undergo the quantum-tunneling) may be referred to as being "unruptured".

Figures 1A, 1B, 1C, 1D, 1E:
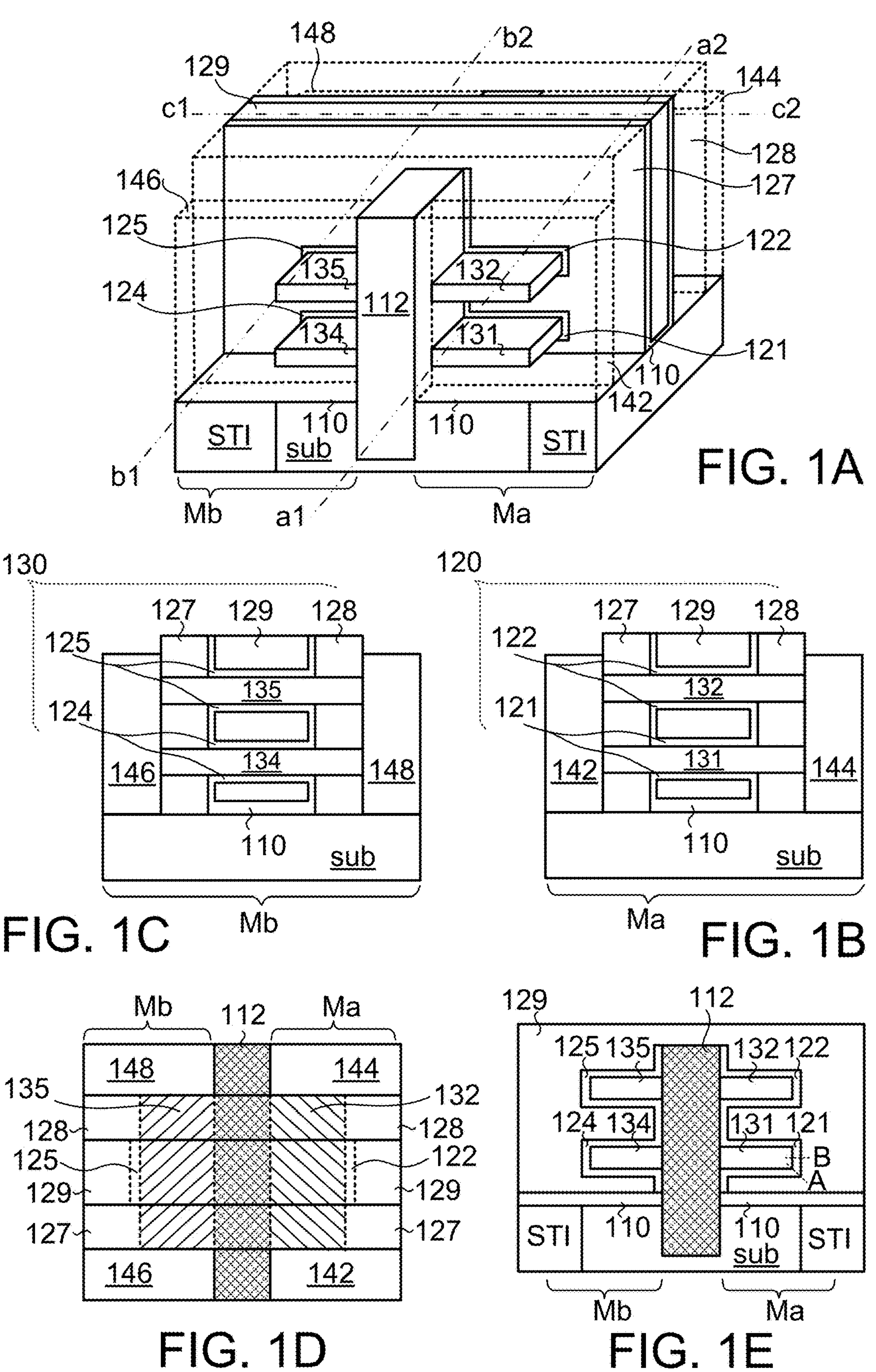
FIG. 1A is a schematic perspective view illustrating the structures of two forksheet transistors according to an embodiment of the present invention.
FIG. 1B is a schematic cross-sectional view illustrating the forksheet transistors as shown in FIG. 1A and taken along the line a1-a2.
FIG. 1C is a schematic cross-sectional view illustrating the forksheet transistors as shown in FIG. 1A and taken along the line b1-b2.
FIG. 1D is a schematic top view illustrating the forksheet transistors as shown in FIG. 1A.
FIG. 1E is a schematic cross-sectional view illustrating the forksheet transistors as shown in FIG. 1A and taken along the line c1-c2.

FIG. 1A is a schematic perspective view illustrating the structures of two forksheet transistors according to an embodiment of the present invention. FIG. 1B is a schematic cross-sectional view illustrating the forksheet transistors as shown in FIG. 1A and taken along the line a1-a2. FIG. 1C is a schematic cross-sectional view illustrating the forksheet transistors as shown in FIG. 1A and taken along the line b1-b2. FIG. 1D is a schematic top view illustrating the forksheet transistors as shown in FIG. 1A. FIG. 1E is a schematic cross-sectional view illustrating the forksheet transistors as shown in FIG. 1A and taken along the line c1-c2.

Please refer to FIGS. 1A to 1E. Firstly, an isolation layer 110 is formed over a semiconductor substrate sub and an isolation structure, and an isolation wall 112 is inserted in the semiconductor substrate sub. For example, the isolation structure is a shallow trench isolation (STI) structure.

Then, two gate structures 120 and 130 are formed on the isolation layer 110, and a portion of the isolation wall 112 is covered by the gate structures 120 and 130. Moreover, four nanowires 131, 132, 134 and 135 are respectively penetrated through the gate structures 120 and 130. A first-portion surface of each of the nanowires 131, 132, 134 and 135 is contacted with the isolation wall 112. A second-portion surface of each of the nanowires 131 and 132 is contacted with the gate structure 120. A second-portion surface of each of the nanowires 134 and 135 is contacted with the gate structure 130. The second-portion surface of each of the nanowire 131, 132, 134 and 135 is divided into a first side region, a second side region and a central region between the first side region and the second side region.

The nanowires 131, 132, 134 and 135 are rectangular nanowires or cylindrical nanowires. In case that the nanowires 131, 132, 134 and 135 are rectangular nanowires, a lateral surface of each of the nanowires 131, 132, 134 and 135 is contacted with the isolation wall 112, the other three lateral surfaces of each of the nanowires 131 and 132 is contacted with the gate structure 120, and the other three lateral surfaces of each of the nanowires 134 and 135 is contacted with the gate structure 130.

As shown in FIG. 1A and FIG. 1D, two drain/source structures 142 and 144 are located beside a first side of the isolation wall 112, and two drain/source structures 146 and 148 are located beside a second side of the isolation wall 112. The first terminals of the nanowires 131 and 132 are electrically contacted with the drain/source structure 142. The second terminals of the nanowires 131 and 132 are electrically contacted with the drain/source structure 144. The first terminals of the nanowires 134 and 135 are electrically contacted with the drain/source structure 146. The second terminals of the nanowires 134 and 135 are electrically contacted with the drain/source structure 148. The drain/source structure 142 and the drain/source structure 146 are separated from each other by the isolation wall 112. Similarly, the drain/source structure 144 and the drain/source structure 148 are separated from each other by the isolation wall 112.

In a variant example, the first terminal and the second terminal of the nanowire 131 are penetrated through and electrically contacted with the drain/source structure 142 and 144, respectively. Similarly, the first terminal and the second terminal of the nanowire 132 are penetrated through and electrically contacted with the drain/source structure 142 and 144, respectively. Similarly, the first terminal and the second terminal of the nanowire 134 are penetrated through and electrically contacted with the drain/source structure 146 and 148, respectively. Similarly, the first terminal and the second terminal of the nanowire 135 are penetrated through and electrically contacted with the drain/source structure 146 and 148, respectively.

In an embodiment, the two drain/source structures 142 and 144, the gate structure 120 and the nanowires 131, 132 are collaboratively formed as a forksheet transistor Ma. The two drain/source structures 142 and 144 may be regarded as two drain/source terminals of the forksheet transistor Ma. The two drain/source structures 146 and 148, the gate structure 130 and the nanowires 134 and 135 are collaboratively formed as another forksheet transistor Mb. The two drain/source structures 146 and 148 may be regarded as two drain/source terminals of the forksheet transistor Mb. Moreover, the two forksheet transistors Ma and Mb are respectively located beside two opposite sides of the isolation wall 112. In an embodiment, the forksheet transistors Ma and Mb are different types of transistors. For example, the forksheet transistor Ma is an N-type transistor, and the forksheet transistor Mb is a P-type transistor. In another embodiment, the forksheet transistors Ma and Mb are of the same type. For example, both of the forksheet transistors Ma and Mb are N-type transistors, or both of the forksheet transistors Ma and Mb are P-type transistors.

The gate structure 120 of the forksheet transistor Ma comprises two spacers 127, 128, two gate dielectric layers 121, 122 and a gate layer 129. The gate layer 129 is made of polysilicon. As shown in FIG. 1A and FIG. 1B, the gate dielectric layer 121 is contacted with a central region of the second-portion surface of the nanowire 131, and the gate dielectric layer 122 is contacted with a central region of the second-portion surface of the nanowire 132. The gate dielectric layers 121 and 122 are covered by the gate layer 129. The first side regions of the second-portion surfaces of the nanowires 131, 132 are contacted with the spacer 127 and supported by the spacer 127. The second side regions of the second-portion surfaces of the nanowires 131 and 132 are contacted with the spacer 128 and supported by the spacer 128. In addition, the spacers 127 and 128 are formed on the semiconductor substrate sub. The portions of the nanowires 131 and 132 that are contacted with the gate structure 120 may be regarded as a nanowire channel region of the forksheet transistor Ma. As shown in FIG. 1B, the gate dielectric layers 121 and 122 are contacted with each other along the lateral walls of the spacers 127 and 128, and the gate dielectric layer 121 is contacted with the isolation layer 110 along the spacers 127 and 128. As shown in FIG. 1E, the gate dielectric layers 121 and 122 are contacted with each other along the lateral wall of the isolation layer 112, and the gate dielectric layer 121 is contacted with the isolation layer 110 along the lateral wall of the isolation wall 112.

The gate structure 130 of the forksheet transistor Mb comprises the two spacers 127, 128, two gate dielectric layers 124, 125 and the gate layer 129. Obviously, the gate layer 129 and the two spacer 127, 128 are shared by the gate structure 120 of the forksheet transistor Ma and the gate structure 130 of the forksheet transistor Mb. As shown in FIG. 1A and FIG. 1C, the gate dielectric layer 124 is contacted with a central region of the second-portion surface of the nanowire 134, and the gate dielectric layer 125 is contacted with a central region of the second-portion surface of the nanowire 135. The gate dielectric layers 124 and 125 are covered by the gate layer 129. The first side regions of the second-portion surfaces of the nanowires 134 and 135 are contacted with the spacer 127 and supported by the spacer 127. The second side regions of the second-portion surfaces of the nanowires 134 and 135 are contacted with the spacer 128 and supported by the spacer 128. In addition, the spacers 127 and 128 are formed on the semiconductor substrate sub. The portions of the nanowires 134 and 135 that are contacted with the gate structure 130 may be regarded as a nanowire channel region of the forksheet transistor Mb. As shown in FIG. 1C, the gate dielectric layers 124 and 125 are contacted with each other along the lateral walls of the spacers 127 and 128, and the gate dielectric layers 124 and 125 are contacted with the isolation layer 110 along the lateral wall of the spacers 127 and 128. As shown in FIG. 1E, the gate dielectric layers 124 and 125 are contacted with each other along the lateral wall of the isolation wall 112, and the gate dielectric layer 124 is contacted with the isolation layer 110 along the lateral wall of the isolation wall 112.

In an embodiment, the drain/source structures 142, the drain/source structure 144, the nanowire 131 and the nanowire 132 of the forksheet transistor Ma have the same dopant type, and the drain/source structure 146, the drain/source structure 148, the nanowire 134 and the nanowire 135 of the forksheet transistor Mb have the same dopant type. For example, all of the drain/source structure 142, the drain/source structure 144, the nanowire 131 and the nanowire 132 of the forksheet transistor Ma are n-type doped regions or p-type doped regions.

In the above embodiment, the gate structure of the forksheet transistor comprises two nanowires. It is noted that the number of nanowires in the forksheet transistor is not restricted.

Please refer to FIG. 1E again. For example, the nanowire 131 is a rectangular nanowire. A lateral surface of the nanowire 131 is contacted with the isolation wall 112. The other three lateral surfaces of the nanowire 131 are contacted with the gate dielectric layer 121 of the gate structure 120. The thickness of the gate dielectric layer 121 is smaller than about 30 Å. For example, in a case that a voltage difference between the gate layer 129 and the nanowire 131 is 3~6V, the electric field (E) at the positions near the flat surface B of the gate dielectric layer 121 is uniformly distributed. Moreover, the electric field (E) near the corner A inside the gate dielectric layer 121 becomes larger and larger, with the largest electric field (E) at the corner junction of the gate dielectric layer 121 and the nanowire 131. The electric field (E) at the corner junction can be increased by at least 50% compared to the electric field (E) at the positions near the flat surface B. That is, if there is a specified high voltage difference between the gate layer 129 and the nanowire 131, the electric field (E) at the junction between the gate dielectric layer 121 and the nanowire 131 is the largest. As a consequence, the gate dielectric layer 121 is ruptured at the corner region A. Due to the above characteristics, a novel antifuse-type one time programming (OTP) memory cell with the forksheet transistors can be specially designed.

In accordance with the present invention, plural forksheet transistors are formed over the semiconductor substrate and collaboratively formed as an OTP memory cell, and the structures of some forksheet transistors are modified. Furthermore, the connecting relationships between these forksheet transistors are specially designed to complete the OTP memory cell of the present invention according to the concepts of the PUF technology.

Figures 2A, 2B:
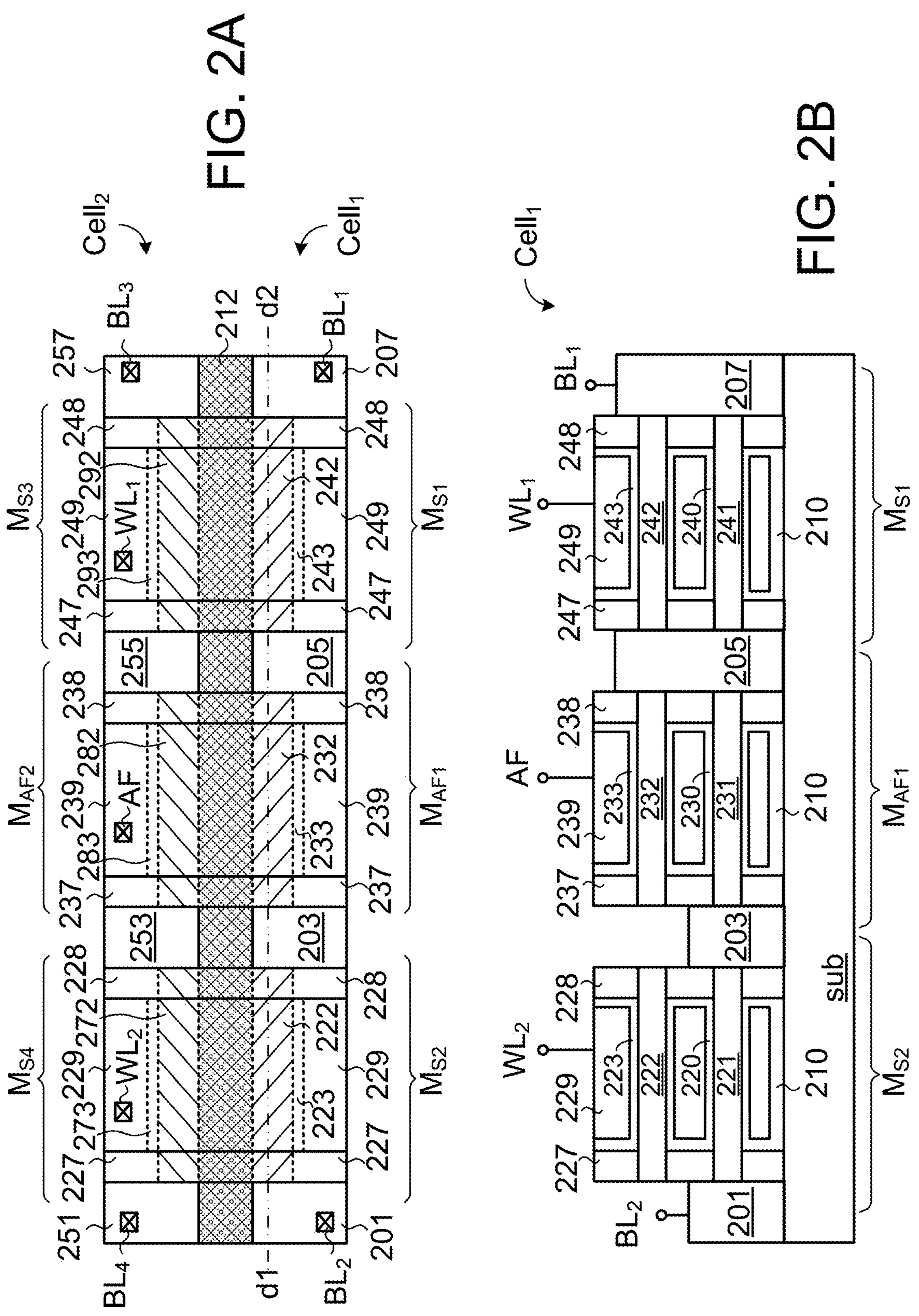
FIG. 2A is a schematic top view illustrating the structure of an OTP memory using a PUF technology according to a first embodiment of the present invention.
FIG. 2B is a schematic cross-sectional view illustrating the OTP memory as shown in FIG. 2A and taken along the dashed line d1-d2.

FIG. 2A is a schematic top view illustrating the structure of an OTP memory using a PUF technology according to a first embodiment of the present invention. FIG. 2B is a schematic cross-sectional view illustrating the OTP memory as shown in FIG. 2A and taken along the dashed line d1-d2. In the first embodiment of the present invention, the OTP memory comprises two memory cells $Cell_1$ and $Cell_2$. The two memory cells $Cell_1$ and $Cell_2$ are respectively located beside a first side and a second side of an isolation wall 212. Each of the memory cells $Cell_1$ and $Cell_2$ comprises three forksheet transistors. The memory cell $Cell_1$ comprises a select transistor $M_{S1}$, a select transistor $M_{S2}$ and an antifuse transistor $M_{AF1}$. The memory cell $Cell_2$ comprises a select transistor $M_{S3}$, a select transistor $M_{S4}$ and an antifuse transistor $M_{AF2}$. The select transistors $M_{S1}$, the select transistor $M_{S2}$, the select transistor $M_{S3}$, the select transistor $M_{S4}$ and the antifuse transistors $M_{AF1}$ and $M_{AF2}$ are forksheet transistors. The structure of each of these transistors is similar to the structure of the forksheet transistor shown in FIG. 1A and not redundantly described herein. In addition, each of these transistors comprises plural nanowires.

As shown in FIGS. 2A and 2B, the select transistor $M_{S1}$ comprises a drain/source structure 205, a drain/source structure 207, a gate structure and plural nanowires 241, 242. The first-portion surfaces of the nanowires 241 and 242 are contacted with the isolation wall 212, and the second-portion surfaces of the nanowires 241 and 242 are contacted with the gate structure. The gate structure comprises two gate dielectric layers 240 and 243, a gate layer 249 and two spacers 247, 248. The central region of the second-portion surface of the nanowire 241 is covered by the gate dielectric layer 240. The central region of the second-portion surface of the nanowire 242 is covered by the gate dielectric layer 243. The two gate dielectric layers 240 and 243 are covered by the gate layer 249. The first side regions of the second-portion surfaces of the nanowires 241 and 242 are contacted with the spacer 247 and supported by the spacer 247. The second side regions of the second-portion surfaces of the nanowires 241 and 242 are contacted with the spacer 248 and supported by the spacer 248. The drain/source structure 205 is electrically contacted with the first terminals of the nanowires 241 and 242. The drain/source structure 207 is electrically contacted with the second terminals of the nanowires 241 and 242. The drain/source structure 207 is electrically connected with a bit line $BL_1$, and the gate layer 249 is electrically connected with a word line $WL_1$.

As shown in FIGS. 2A and 2B, the antifuse transistor $M_{AF1}$ comprises a drain/source structure 203, the drain/source structure 205, a gate structure and plural nanowires 231, 232. The first-portion surfaces of the nanowires 231 and 232 are contacted with the isolation wall 212, and the second-portion surfaces of the nanowires 231 and 232 are contacted with the gate structure. The gate structure comprises two gate dielectric layers 230 and 233, a gate layer 239 and two spacers 237, 238. The central region of the second-portion surface of the nanowire 231 is covered by the gate dielectric layer 230. The central region of the second-portion surface of the nanowire 232 is covered by the gate dielectric layer 233. The two gate dielectric layers 230 and 233 are covered by the gate layer 239. The first side regions of the second-portion surfaces of the nanowires 231 and 232 are contacted with the spacer 237 and supported by the spacer 237. The second side regions of the second-portion surfaces of the nanowires 231 and 232 are contacted with the spacer 238 and supported by the spacer 238. The drain/source structure 203 is electrically contacted with the first terminal of the nanowire 231, but the drain/source structure 203 is not electrically contacted with the first terminal of the nanowire 232. The drain/source structure 205 is electrically contacted with the second terminals of the nanowires 231 and 232. The gate layer 239 is electrically connected with an antifuse line AF.

As shown in FIGS. 2A and 2B, the select transistor $M_{S2}$ comprises a drain/source structure 201, the drain/source structure 203, a gate structure and plural nanowires 221, 222. The first-portion surfaces of the nanowires 221 and 222 are contacted with the isolation wall 212, and the second-portion surfaces of the nanowires 221 and 222 are contacted with the gate structure. The gate structure comprises two gate dielectric layers 220 and 223, a gate layer 229 and two spacers 227, 228. The central region of the second-portion surface of the nanowire 221 is covered by the gate dielectric layer 220. The central region of the second-portion surface of the nanowire 222 is covered by the gate dielectric layer 223. The two gate dielectric layers 220 and 223 are covered by the gate layer 229. The first side regions of the second-portion surfaces of the nanowires 221 and 222 are contacted with the spacer 227 and supported by the spacer 227. The second side regions of the second-portion surfaces of the nanowires 221 and 222 are contacted with the spacer 228 and supported by the spacer 228. The drain/source structure 201 is electrically contacted with the first terminal of the nanowire 221. The drain/source structure 203 is electrically contacted with the second terminal of the nanowire 221. The first terminal of the nanowire 222 is not electrically contacted with the drain/source structure 203. According to the practical requirements, the second terminal of the nanowire 222 is electrically contacted or not contacted electrically with the drain/source structure 201. Moreover, the drain/source structure 201 is electrically connected with a bit line $BL_2$, and the gate layer 229 is electrically connected with a word line $WL_2$.

As shown in FIG. 2B, the nanowires 241, 221 and 231 of the select transistor $M_{S1}$, the select transistor $M_{S2}$ and the antifuse transistor $M_{AF1}$ are electrically connected with each other through the drain/source structures 203 and 205. In a variant example, a long nanowire structure is provided, and the nanowire structure is divided into three parts. The first part of the nanowire structure is served as the nanowire 241 of the select transistor $M_{S1}$, the second part of the nanowire structure is served as the nanowire 231 of the antifuse transistor $M_{AF1}$, and the third part of the nanowire structure is served as the nanowire 221 of the select transistor $M_{S2}$. That is, the nanowires 221, 231 and 241 are integrally formed. Similarly, the nanowires 232 and 242 are integrally formed.

The structure of the memory cell $Cell_2$ is similar to the structure of the memory cell $Cell_1$. For succinctness, the structures of the select transistor $M_{S3}$, the select transistor $M_{S4}$ and the antifuse transistor $M_{AF2}$ will be briefly described as follows.

Please refer to FIG. 2A again. The structure of the memory cell $Cell_2$ will be described as follows. The first-portion surfaces of plural nanowires 272, 282 and 292 are contacted with the isolation wall 212. The second-portion surfaces of the nanowires 272, 282, 292 are respectively contacted with the corresponding gate structures. The central region of the second-portion surface of the nanowire 272 is covered by a gate dielectric layer 273. The gate dielectric layer 273 is covered by the gate layer 229. The first side region of the second-portion region of the nanowire 272 is contacted with the spacer 227. The second side region of the second-portion surface of the nanowire 272 is contacted with the spacer 228. The central region of the second-portion surface of the nanowire 282 is covered by a gate dielectric layer 283. The gate dielectric layer 283 is covered by the gate layer 239. The first side region of the second-portion surface of the nanowire 282 is contacted with the spacer 237. The second side region of the second-portion surface of the nanowire 282 is contacted with the spacer 238. The central region of the second-portion surface of the nanowire 292 is covered by a gate dielectric layer 293. The gate dielectric layer 293 is covered by the gate layer 249. The first side region of the second-portion surface of the nanowire 292 is contacted with the spacer 247. The second side region of the second-portion surface of the nanowire 292 is contacted with the spacer 248.

A drain/source structure 251 is electrically connected with a bit line $BL_4$. In addition, the drain/source structure 251 is not electrically connected with the first terminal of the nanowire 272. A drain/source structure 253 is not electrically connected with the second terminal of the nanowire 272 and the first terminal of the nanowire 282. A drain/source terminal 255 is electrically connected with the second terminal of the nanowire 282 and the first terminal of the nanowire 292. A drain/source structure 257 is electrically connected with the second terminal of the nanowire 292. In addition, the drain/source structure 257 is electrically connected with a bit line $BL_3$.

As mentioned above, the present invention provides an OTP memory using the PUF technology. The OTP memory comprises two memory cells $Cell_1$ and $Cell_2$, which are respectively located beside the first side and the second side of the isolation wall 212. The gate layer 249 and the two spacers 247 and 248 are shared by the select transistor $M_{S1}$ of the memory cell $Cell_1$ and the select transistor $M_{S3}$ of the memory cell $Cell_2$. The gate layer 249 is connected with the word line $WL_1$. The gate layer 239 and the two spacers 237 and 238 are shared by the antifuse transistor $M_{AF1}$ of the memory $Cell_1$ and the antifuse transistor $M_{AF2}$ of the memory cell $Cell_2$. The gate layer 239 is electrically connected with the antifuse line AF. The gate layer 229 and the two spacers 227 and 228 are shared by the select transistor $M_{S2}$ of the memory cell $Cell_1$ and the select transistor $M_{S4}$ of the memory cell $Cell_2$. The gate layer 229 is electrically connected with the word line $WL_2$.

In the above embodiment, each of the antifuse transistor $M_{AF1}$ in the memory cell $Cell_1$ and the antifuse transistor $M_{AF2}$ in the memory cell $Cell_2$ comprises plural nanowires. In addition, each of the memory cells $Cell_1$ and $Cell_2$ includes an enroll path and a read path. The plural nanowires in each of the memory cells $Cell_1$ and $Cell_2$ are divided into two portions. The first portion and the second portion of the plural nanowires are included in the enroll paths. The first portion of the plural nanowires is included in the read path. However, the second portion of the plural nanowires is not included in the read path.

Take the memory cell $Cell_1$ for example. The region between the antifuse line AF and the bit line $BL_1$ is the enroll path. The region between the antifuse line AF and the bit line $BL_2$ is the read path. Moreover, the antifuse transistor $M_{AF1}$ of the memory cell $Cell_1$ comprises plural nanowires 231 and 232. The plural nanowires 231 and 232 are divided into two portions. The first portion and the second portion of the two nanowires 231 and 232 are included in the enroll path. That is, the nanowires 231 and 232 are connected between the antifuse line AF and the bit line $BL_1$. However, the first portion of the plural nanowires 231 and 232 (i.e., the nanowire 231) is included in the read path, but the second portion of the plural nanowires (i.e., the nanowire 232) is not included in the read path. That is, the nanowire 231 is connected between the antifuse line AF and the bit line $BL_2$, but the nanowire 232 is not connected between the antifuse line AF and the bit line $BL_2$.

Figures 3A, 3B:
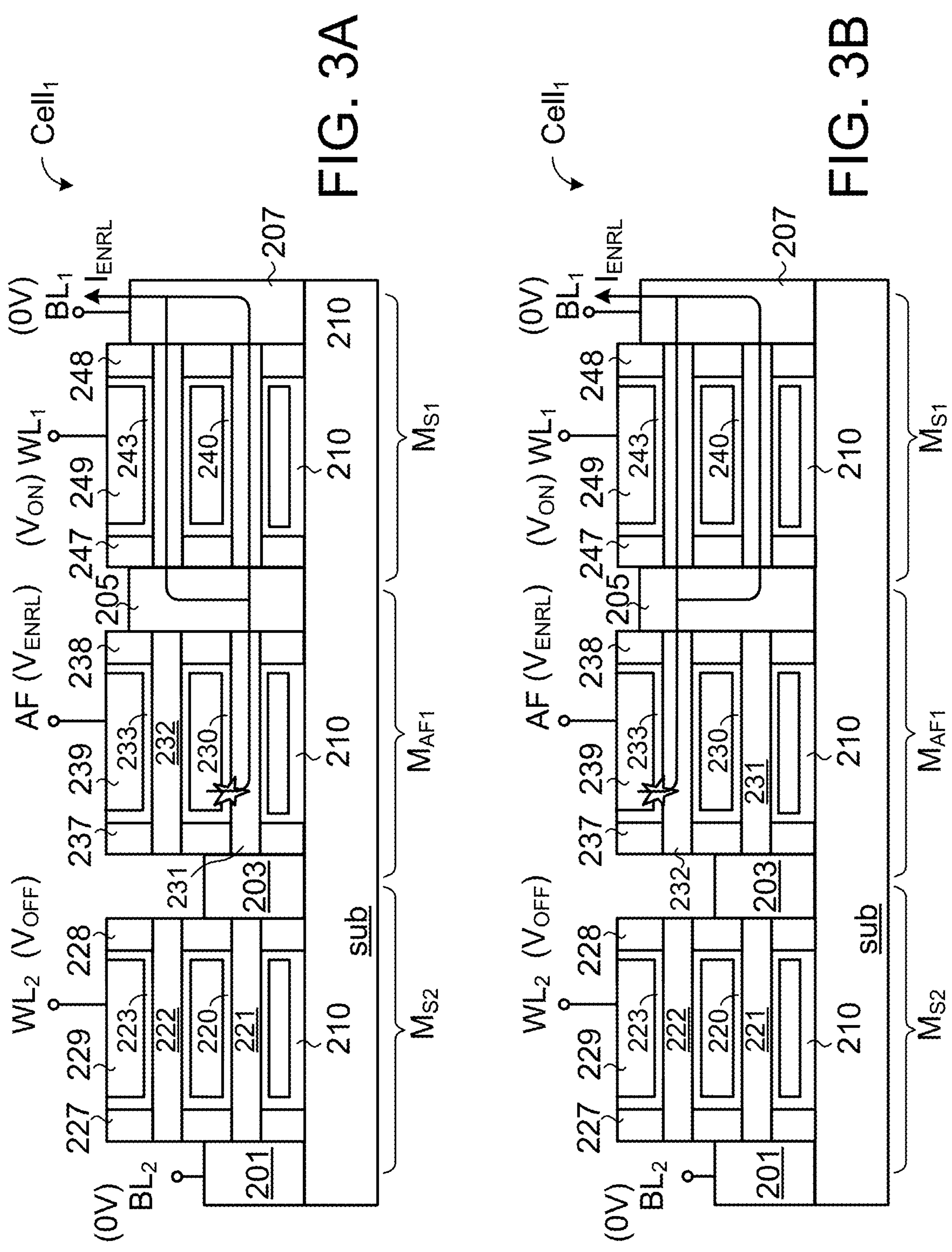
FIG. 3A and FIG. 3B schematically illustrate associated bias voltages for performing an enroll action on the OTP memory according to the first embodiment of the present invention.
Figures 3C, 3D:
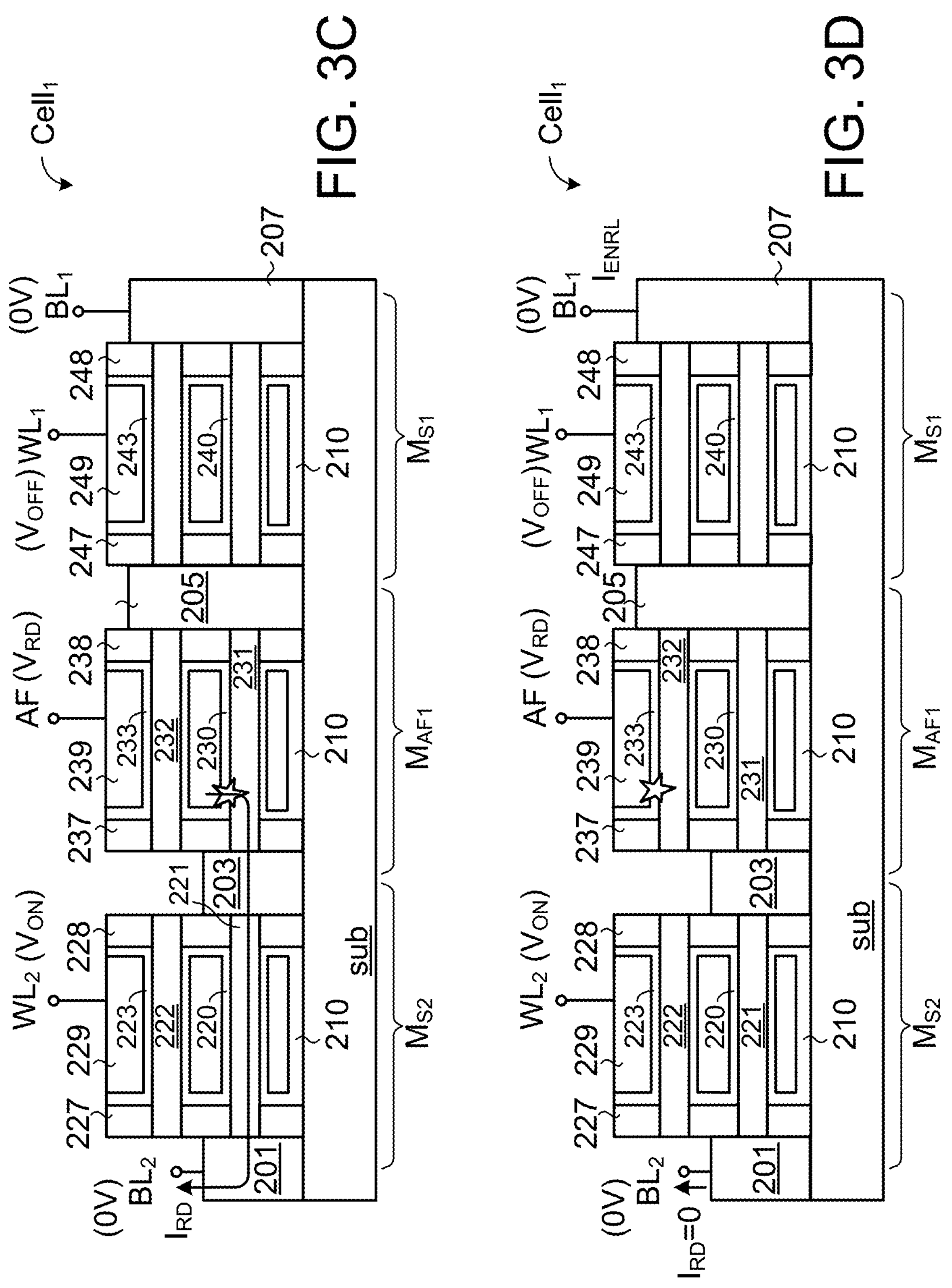
FIG. 3C and FIG. 3D schematically illustrate associated bias voltages for performing a read action on the OTP memory according to the first embodiment of the present invention.

FIG. 3A and FIG. 3B schematically illustrate associated bias voltages for performing an enroll action on the OTP memory according to the first embodiment of the present invention. FIG. 3C and FIG. 3D schematically illustrate associated bias voltages for performing a read action on the OTP memory according to the first embodiment of the present invention. Generally, the two memory cells $Cell_1$ and $Cell_2$ of the OTP memory can be subjected to the enroll action or the read action simultaneously. For succinctness, only the enroll action and the read action performed on the memory cell Cell will be described as follows.

In the memory cell $Cell_1$, the region between the antifuse line AF and the bit line $BL_1$ is an enroll path. When the select transistor $M_{S1}$ is turned on, the enroll path is turned on. When the select transistor $M_{S1}$ is turned off, the enroll path is turned off. Similarly, the region between the antifuse line AF and the bit line $BL_2$ and is a read path. When the second select transistor $M_{S2}$ is turned on, the read path is turned on. When the second select transistor $M_{S2}$ is turned off, the read path is turned off.

Please refer to FIG. 3A and FIG. 3B. When the enroll action is performed, the bit line $BL_1$ receives a ground voltage (0V), the word line $WL_1$ receives an on voltage $V_{ON}$, the antifuse line AF receives an enroll voltage $V_{ENRL}$, the word line $WL_2$ receives the off voltage $V_{OFF}$, and the bit line $BL_2$ receives the ground voltage (0V). For example, the enroll voltage $V_{ENRL}$ is in the range between 3V and 6V, the on voltage $V_{ON}$ is in the range between 0.4V and 3V, and the off voltage $V_{OFF}$ is 0V. Under this circumstance, the select transistor $M_{S1}$ is turned on, and the select transistor $M_{S2}$ is turned off. That is, the enroll path is turned on, and the read path is turned off. Moreover, if the bit line $BL_3$ of the OTP memory receives the ground voltage (0V), the enroll path of the memory cell $Cell_2$ is also turned on. That is, the memory cells $Cell_1$ and $Cell_2$ can be subjected to the enroll action simultaneously.

In the enroll path, the select transistor $M_{S1}$ is turned on. Consequently, the ground voltage (0V) of the bit line $BL_1$ is transmitted to the drain/source structure 205 and the nanowires 231 and 232 of the antifuse transistor $M_{AF1}$ through the select transistor $M_{S1}$. Consequently, when the antifuse line AF receives the enroll voltage $V_{ENRL}$, the voltage stress between the nanowires 231 and 232 and the gate layer 239 of the antifuse transistor $M_{AF1}$ is equal to the enroll voltage $V_{ENRL}$. Under this circumstance, one of the two gate dielectric layers 230 and 233 of the antifuse transistor $M_{AF1}$ is ruptured.

Due to the process variation of the memory cell $Cell_1$, it is unable to predict which of the gate dielectric layers 230 and 233 of the antifuse transistor $M_{AF1}$ is ruptured when the enroll action is performed. Consequently, the PUF technology can be applied to the memory cell of the first embodiment.

For example, in the memory cell $Cell_1$ as shown in FIG. 3A, the gate dielectric layer 230 is ruptured after the enroll action is completed. Consequently, an enroll current $I_{ENRL}$ is generated. The enroll current $I_{ENRL}$ flows from the antifuse line AF to the bit line $BL_1$ through the gate layer 239, the gate dielectric layer 230, the nanowire 231, the drain/source structure 205 and the select transistor $M_{S1}$. Since the gate dielectric layer 230 is ruptured, the region between the gate layer 239 and the nanowire 231 has a low resistance value.

Alternatively, in the memory cell $Cell_1$ as shown in FIG. 3B, the gate dielectric layer 233 is ruptured when the enroll action is performed. Consequently, an enroll current $I_{ENRL}$ is generated. The enroll current $I_{ENRL}$ flows from the antifuse line AF to the bit line $BL_1$ through the gate layer 239, the gate dielectric layer 233, the nanowire 232, the drain/source structure 205 and the select transistor $M_{S1}$. Since the gate dielectric layer 233 is ruptured, the region between the gate layer 239 and the nanowire 232 has a low resistance value.

In the memory cell $Cell_1$, only the nanowire 231 of the antifuse transistor $M_{AF1}$ is connected with the drain/source structure 203. However, the nanowire 232 of the antifuse transistor $M_{AF1}$ is not connected with the drain/source structure 203. Since the nanowire 232 of the antifuse transistor $M_{AF1}$ is not connected between the bit line $BL_2$ and the antifuse line AF, the nanowire 232 is not included in the read path. That is, only the nanowire 231 of the antifuse transistor $M_{AF1}$ is included in the read path.

Please refer to FIGS. 3C and 3D. When the read action is performed, the bit line $BL_1$ receives the ground voltage (0V), the word line $WL_1$ receives the off voltage $V_{OFF}$, the antifuse line AF receives a read voltage $V_{RD}$, the word line $WL_2$ receives the on voltage $V_{ON}$, and the bit line $BL_2$ receives the ground voltage (0V). For example, the read voltage $V_{RD}$ is in the range between 0.75V and 1.2V. Under this circumstance, the select transistor $M_{S1}$ is turned off, and the select transistor $M_{S2}$ is turned on. That is, the enroll path is turned off, and the read path is turned on. Moreover, if the bit line $BL_4$ of the OTP memory receives the ground voltage (0V), the read path of the memory cell $Cell_2$ is also turned on. That is, the memory cells $Cell_1$ and $Cell_2$ are subjected to the read action simultaneously.

As shown in FIG. 3C, the gate dielectric layer 230 of the antifuse transistor $M_{AF1}$ is ruptured, and the region between the nanowire 231 and the gate layer 239 has the low resistance value. Under this circumstance, the read path of the memory cell $Cell_1$ generates a higher read current $I_{RD}$. The read current $I_{RD}$ flows from the antifuse line AF to the bit line $BL_2$ through the gate layer 239, the gate dielectric layer 230, the nanowire 231, the drain/source structure 203 and the select transistor $M_{S2}$. Since the other gate dielectric layer 233 of the antifuse transistor $M_{AF1}$ is not ruptured, the read current $I_{RD}$ does not flow through the corresponding nanowire 232.

As shown in FIG. 3D, the gate dielectric layer 233 of the antifuse transistor $M_{AF1}$ is ruptured, and the region between the nanowire 232 and the gate layer 239 has the low resistance value. However, the nanowire 232 is not electrically connected with the drain/source structure 203. That is, the nanowire 232 is not connected with the select transistor $M_{S2}$. Under this circumstance, the nanowire 232 is not included in the read path. Consequently, no read current $I_{RD}$ is generated by the memory cell $Cell_1$. That is, the magnitude of the read current flowing through the read path between the antifuse line AF and the bit line $BL_2$ is nearly zero ($I_{RD}$=0).

As mentioned above, the read action is performed after the enroll action is completed. When the read action is performed, one bit of a random code can be determined according to the magnitude of the read current $I_{RD}$ in the bit line $BL_2$. For example, a current comparator is provided. The current comparator receives the read current $I_{RD}$ and a reference current Iref. If the magnitude of the read current $I_{RD}$ is higher than the magnitude of the reference current Iref, a first logic value (e.g., "0") is determined as the random code. Whereas, if the magnitude of the read current $I_{RD}$ is lower than the magnitude of the reference current Iref, a second logic value (e.g., "1") is determined as the random code.

As mentioned above, the present invention provides the OTP memory using the PUF technology. In the memory cell of the OTP memory, the antifuse transistor $M_{AF1}$ is a forksheet transistor, and the antifuse transistor $M_{AF1}$ comprises plural nanowires. For example, the antifuse transistor $M_{AF1}$ of the memory cell $Cell_1$ as shown in FIG. 2B comprises the two nanowires 231 and 232. These nanowires are divided into two groups. The first terminal of the nanowire 231 in the first group is electrically connected with the drain/source structure 205. The second terminal of the nanowire 231 in the first group is electrically connected with the drain/source structure 203. The first terminal of the nanowire 232 in the second group is electrically contacted with the drain/source structure 205. The second terminal of the nanowire 232 in the second group is not electrically connected with the drain/source structure 203.

Moreover, If the gate dielectric layer 230 covering the nanowire 231 in the first group is ruptured after the enroll action is completed, the implementation of the read action can confirm that the one-bit random code has the first logic value (e.g., "0") according to the magnitude of the read current $I_{RD}$. Whereas, if the gate dielectric layer 233 covering the nanowire 232 in the second group is ruptured after the enroll action is completed, the implementation of the read action can confirm that the one-bit random code has the second logic value (e.g., "1") according to the magnitude of the read current $I_{RD}$.

In the memory cell $Cell_1$ of the first embodiment, each of the select transistor $M_{S1}$, the select transistor $M_{S2}$ and the antifuse transistor $M_{AF1}$ has two nanowires. It is noted that numerous modifications and alterations may be made while retaining the teachings of the invention. For example, in some other embodiments, the select transistor $M_{S1}$ has X nanowires, the select transistor $M_{S2}$ has Y nanowires, and the antifuse transistor $M_{AF1}$ has Z nanowires. X, Y and Z are all positive integers, X is greater than or equal to 1, Y is greater than or equal to 1, and Z is greater than or equal to 2. Moreover, the Z nanowires of the antifuse transistor $M_{AF1}$ are divided into a first group and a second group. The select transistor $M_{S1}$ is electrically connected with the first group of nanowires and the second group of nanowires in the antifuse transistor $M_{AF1}$. The select transistor $M_{S2}$ is electrically connected with the first group of nanowires in the antifuse transistor $M_{AF1}$ only.

For example, in a variant example of the memory cell of the first embodiment, the select transistor $M_{S1}$ has 1 nanowire (X=1), the select transistor $M_{S2}$ has 1 nanowire (Y=1), and the antifuse transistor $M_{AF1}$ has two nanowires (Z=2). Due to this structural design, the memory cell using the PUF technology has the smallest size.

Figures 4A, 4B:
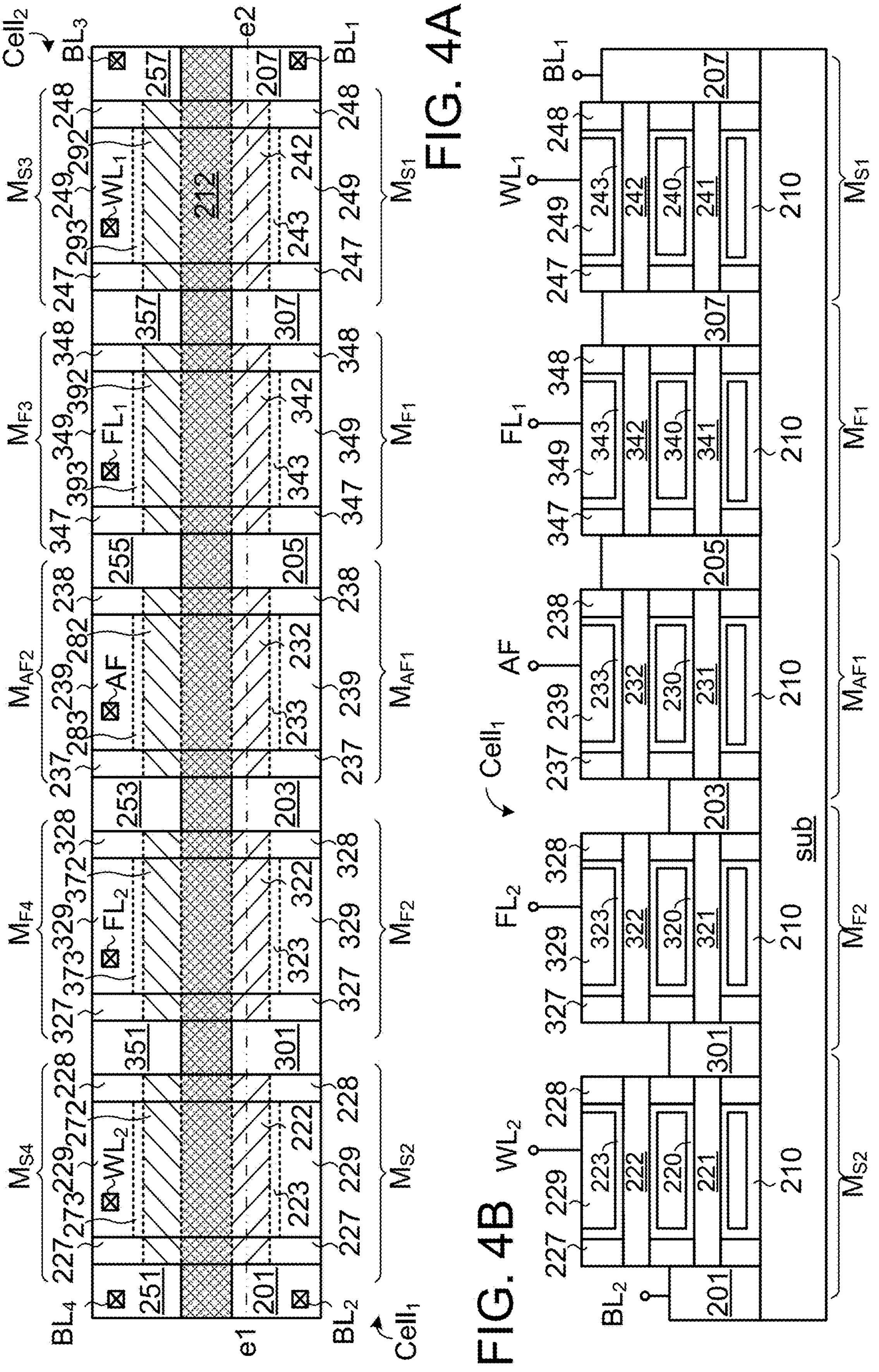
FIG. 4A is a schematic top view illustrating the structure of an OTP memory using a PUF technology according to a second embodiment of the present invention.
FIG. 4B is a schematic cross-sectional view illustrating the OTP memory as shown in FIG. 4A and taken along the dashed line e1-e2.

FIG. 4A is a schematic top view illustrating the structure of an OTP memory using a PUF technology according to a second embodiment of the present invention. FIG. 4B is a schematic cross-sectional view illustrating the OTP memory as shown in FIG. 4A and taken along the dashed line e1-e2. In the second embodiment of the present invention, the OTP memory comprises two memory cells $Cell_1$ and $Cell_2$. The two memory cells $Cell_1$ and $Cell_2$ are respectively located beside a first side and a second side of an isolation wall 212. Each of the memory cells $Cell_1$ and $Cell_2$ comprises five forksheet transistors. The memory cell $Cell_1$ comprises a select transistor $M_{S1}$, a following transistor $M_{F1}$, a select transistor $M_{S2}$, a following transistor $M_{F2}$ and an antifuse transistor $M_{AF1}$. The memory cell $Cell_2$ comprises a select transistor $M_{S3}$, a following transistor $M_{F3}$, a select transistor $M_{S4}$, a following transistor $M_{F4}$ and an antifuse transistor $M_{AF2}$. These transistors are forksheet transistors. The structure of each of these transistors is similar to the structure of the forksheet transistor shown in FIG. 1A and not redundantly described herein. In addition, each of these transistors comprises plural nanowires.

In comparison with the first embodiment, the memory cell of the second embodiment further comprises two following transistors. The memory cell $Cell_1$ shown in FIG. 2B and the memory cell $Cell_1$ shown in FIG. 4B are distinguished. In the memory cell $Cell_1$ of the first embodiment, the select transistor $M_{S1}$ is directly coupled to the antifuse transistor $M_{AF1}$, and the select transistor $M_{S2}$ is directly coupled to the antifuse transistor $M_{AF1}$. In the memory cell $Cell_1$ of the second embodiment, the select transistor $M_{S1}$ is coupled to the antifuse transistor $M_{AF1}$ through the following transistor $M_{F1}$, and the select transistor $M_{S2}$ is coupled to the antifuse transistor $M_{AF1}$ through the following transistor $M_{F2}$. That is, in the memory cell $Cell_1$ of the second embodiment, the following transistor $M_{F1}$ is connected between the select transistor $M_{S1}$ and the antifuse transistor $M_{AF1}$, and the following transistor $M_{F2}$ is connected between the select transistor $M_{S2}$ and the antifuse transistor $M_{AF1}$. For succinctness, only the structures of the following transistors $M_{F1}$ and $M_{F2}$ will be described as follows.

As shown in FIGS. 4A and 4B, the following transistor $M_{F1}$ comprises the drain/source structure 205, a drain/source structure 307, a gate structure and plural nanowires 341, 342. The first-portion surfaces of the nanowires 341 and 342 are contacted with the isolation wall 212, and the second-portion surfaces of the nanowires 341 and 342 are contacted with the gate structure. The gate structure comprises two gate dielectric layers 340 and 343, a gate layer 349 and two spacers 347, 348. The central region of the second-portion surface of the nanowire 341 is covered by the gate dielectric layer 340. The central region of the second-portion surface of the nanowire 342 is covered by the gate dielectric layer 343. The two gate dielectric layers 340 and 343 are covered by the gate layer 349. The first side regions of the second-portion surfaces of the nanowires 341 and 342 are contacted with the spacer 347 and supported by the spacer 347. The second side regions of the second-portion surfaces of the nanowires 341 and 342 are contacted with the spacer 348 and supported by the spacer 348. The drain/source structure 205 is electrically contacted with the first terminals of the nanowires 341 and 342. The drain/source structure 307 is electrically contacted with the second terminals of the nanowires 341 and 342. The gate layer 349 is electrically connected with a following line $FL_1$. The drain/source structure 307 is electrically connected with the nanowires 241 and 242 of the select transistor $M_{S1}$.

As shown in FIGS. 4A and 4B, the following transistor $M_{F2}$ comprises a drain/source structure 301, the drain/source structure 203, a gate structure and plural nanowires 321, 322. The first-portion surfaces of the nanowires 321 and 322 are contacted with the isolation wall 212, and the second-portion surfaces of the nanowires 321 and 322 are contacted with the gate structure. The gate structure comprises two gate dielectric layers 320 and 323, a gate layer 329 and two spacers 327, 328. The central region of the second-portion surface of the nanowire 321 is covered by the gate dielectric layer 320. The central region of the second-portion surface of the nanowire 322 is covered by the gate dielectric layer 323. The two gate dielectric layers 320 and 323 are covered by the gate layer 329. The first side regions of the second-portion surfaces of the nanowires 321 and 322 are contacted with the spacer 327 and supported by the spacer 327. The second side regions of the second-portion surfaces of the nanowires 321 and 322 are contacted with the spacer 328 and supported by the spacer 328. The drain/source structure

203 is electrically contacted with the first terminal of the nanowire 321, and the drain/source structure 203 is not electrically contacted with the first terminal of the nanowire 322. The drain/source structure 301 is electrically contacted with the second terminal of the nanowire 321, and the drain/source structure 301 is not electrically contacted with the second terminal of the nanowire 322. The gate layer 329 is electrically connected with a following line $FL_2$. The drain/source structure 301 is electrically connected with the nanowire 221 of the select transistor $M_{S2}$ and the drain/source structure 301 is not electrically connected with the nanowire 222 of the select transistor $M_{S2}$.

As shown in FIG. 4A, the structure of the memory cell $Cell_2$ is similar to the structure of the memory cell $Cell_1$. For succinctness, only the structures of the following transistors $M_{F3}$ and $M_{F4}$ will be briefly described as follows.

Please refer to FIG. 4A again. The structures of the following transistors $M_{F3}$ and $M_{F4}$ in the memory cell $Cell_2$ will be described as follows. The first-portion surfaces of plural nanowires 372 and 392 are contacted with the isolation wall 212. The second-portion surfaces of the nanowires 372 and 392 are respectively contacted with the corresponding gate structures. The central region of the second-portion surface of the nanowire 372 is covered by a gate dielectric layer 373. The gate dielectric layer 373 is covered by the gate layer 329. The first side region of the second-portion region of the nanowire 372 is contacted with the spacer 327. The second side region of the second-portion surface of the nanowire 372 is contacted with the spacer 328. The central region of the second-portion surface of the nanowire 392 is covered by a gate dielectric layer 393. The gate dielectric layer 393 is covered by the gate layer 349. The first side region of the second-portion surface of the nanowire 392 is contacted with the spacer 347. The second side region of the second-portion surface of the nanowire 392 is contacted with the spacer 348.

A drain/source structure 351 is not electrically connected with the second terminal of the nanowire 372 and the first terminal of the nanowire 272. The drain/source terminal 253 is not electrically connected with the second terminal of the nanowire 372 and the first terminal of the nanowire 282. The drain/source structure 255 is electrically connected between the second terminal of the nanowire 282 and the first terminal of the nanowire 392. A drain/source structure 357 is electrically connected between the second terminal of the nanowire 392 and the first terminal of the nanowire 292.

From the above descriptions, the present invention provides an OTP memory using the PUF technology. The OTP memory comprises two memory cells $Cell_1$ and $Cell_2$, which are respectively located beside the first side and the second side of the isolation wall 212. In addition, each of the antifuse transistor $M_{AF1}$ in the memory cell $Cell_1$ and the antifuse transistor $M_{AF2}$ in the memory cell $Cell_2$ comprises plural nanowires. In addition, each of the memory cells $Cell_1$ and $Cell_2$ includes an enroll path and a read path. The plural nanowires in each of the memory cells $Cell_1$ and $Cell_2$ are divided into two portions. The first portion and the second portion of the plural nanowires are included in the enroll paths. The first portion of the plural nanowires is included in the read path. However, the second portion of the plural nanowires is not included in the read path.

Take the memory cell $Cell_1$ for example. The region between the antifuse line AF and the bit line $BL_1$ is the enroll path. The region between the antifuse line AF and the bit line $BL_2$ is the read path. Moreover, the antifuse transistor $M_{AF1}$ of the memory cell $Cell_1$ comprises plural nanowires 231 and 232. The plural nanowires 231 and 232 are divided into two portions. The first portion and the second portion of the two nanowires 231 and 232 are included in the enroll path. However, the first portion of the plural nanowires 231 and 232 (i.e., the nanowire 231) is included in the read path, but the second portion of the plural nanowires (i.e., the nanowire 232) is not included in the read path.

When the enroll path is turned on and the read path is turned off, the enroll action is performed on the memory cell $Cell_1$. When the enroll path is turned off and the read path is turned on, the read action is performed on the memory cell $Cell_1$, and one bit of a random code can be determined.

When the enroll action or the read action is performed, the bias voltages provided to the antifuse line AF, the bit line $BL_1$ and the bit line $BL_2$ may be referred to the bias voltages of the first embodiment, and not redundantly described herein.

When the enroll action is performed on the memory cell $Cell_1$, an on voltage $V_{ON1}$ is provided to the word line $WL_1$, and an on voltage $V_{ON2}$ is provided to the following line $FL_1$. Consequently, the enroll path is turned on. In addition, an off voltage $V_{OFF}$ is provided to the word line $WL_2$ and the following line $FL_2$. Consequently, the read path is turned off. Meanwhile, one of the plural gate dielectric layers of the antifuse transistor $M_{AF1}$ is ruptured. For example, the on voltage $V_{ON1}$ is in the range between 0.4V and 3V, and the on voltage $V_{ON2}$ is in the range between 0.4V and 3V. It is noted that the magnitude of the on voltage $V_{ON1}$ and the magnitude of the on voltage $V_{ON2}$ may be identical or different.

When the read action is performed on the memory cell $Cell_1$, the on voltage $V_{ON1}$ is provided to the word line $WL_2$, and the on voltage $V_{ON2}$ is provided to the following line $FL_2$. Consequently, the read path is turned on. In addition, the off voltage $V_{OFF}$ is provided to the word line $WL_1$ and the following line $FL_1$. Consequently, the enroll path is turned off. According to the magnitude of the read current in the read path, one bit of the random code can be obtained.

In the memory cell $Cell_1$ of the second embodiment, each of the select transistor $M_{S1}$, the select transistor $M_{S2}$, the following transistor $M_{F1}$, the following transistor $M_{F2}$ and the antifuse transistor $M_{AF1}$ has two nanowires. It is noted that numerous modifications and alterations may be made while retaining the teachings of the invention. For example, in some other embodiments, the select transistor $M_{S1}$ has X nanowires, the select transistor $M_{S2}$ has Y nanowires, the antifuse transistor $M_{AF1}$ has Z nanowires, the following transistor $M_{F1}$ has V nanowires, and the following transistor $M_{F2}$ has W nanowires. V, W, X, Y, Z are all positive integers, V is greater than or equal to 1, W is greater than or equal to 1, X is greater than or equal to 1, Y is greater than or equal to 1, and Z is greater than or equal to 2. Moreover, the Z nanowires of the antifuse transistor $M_{AF1}$ are divided into a first group and a second group. The V nanowires of the following transistor $M_{F1}$ are electrically connected with the first group of nanowires and the second group of nanowires in the antifuse transistor $M_{AF1}$. The following transistor $M_{F2}$ is electrically connected with the first group of nanowires in the antifuse transistor $M_{AF1}$ only.

For example, in a variant example of the memory cell of the second embodiment, the select transistor $M_{S1}$ has 1 nanowire (X=1), the select transistor $M_{S2}$ has 1 nanowire (Y=1), the following transistor $M_{F1}$ has 1 nanowire (V=1), the following transistor $M_{F2}$ has 1 nanowire (W=1), and the antifuse transistor $M_{AF1}$ has two nanowires (Z=2). Due to this structural design, the memory cell using the PUF technology has the smallest size.

Figures 5A, 5B:
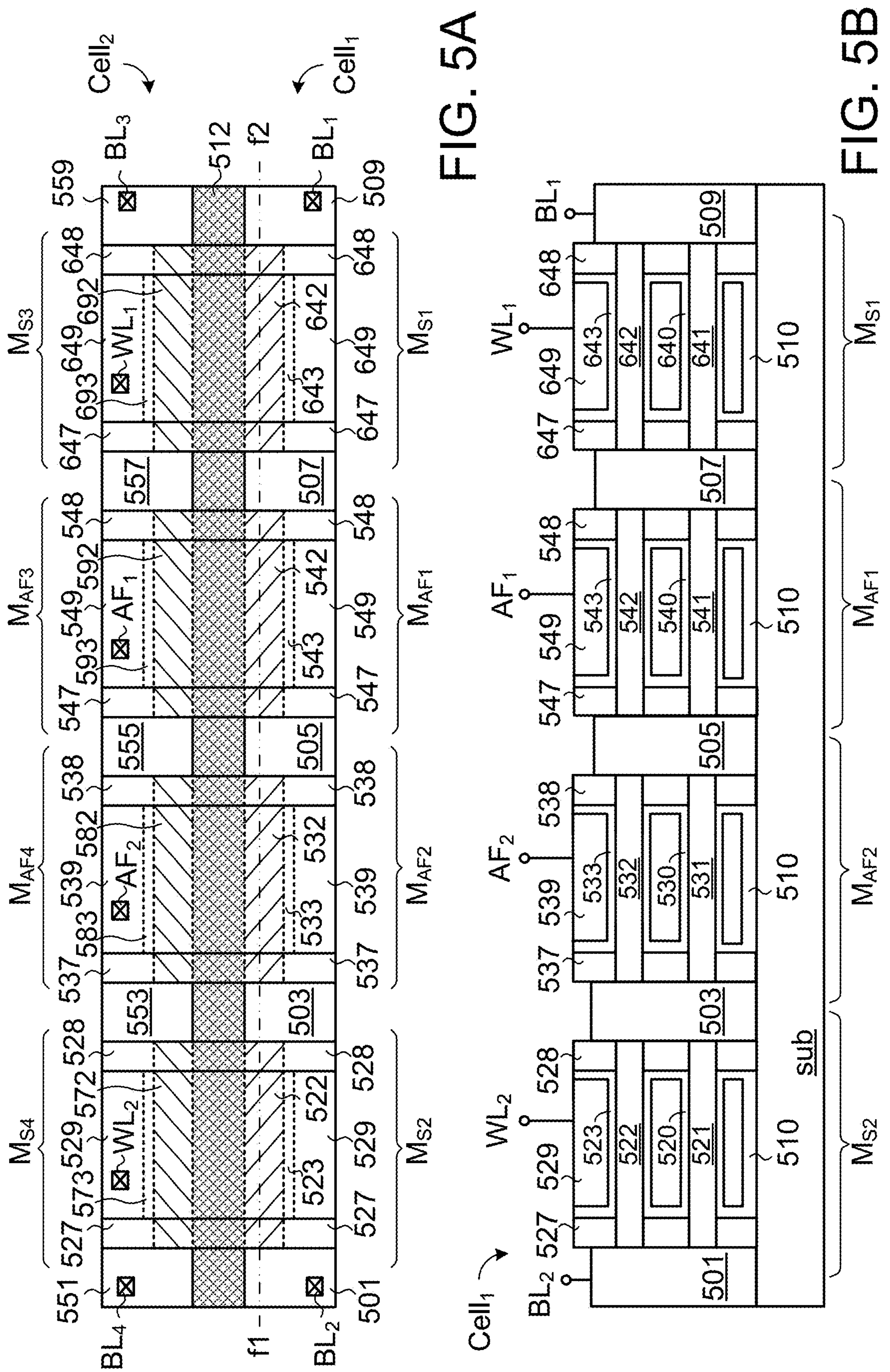
FIG. 5A is a schematic top view illustrating the structure of an OTP memory using a PUF technology according to a third embodiment of the present invention.
FIG. 5B is a schematic cross-sectional view illustrating the OTP memory as shown in FIG. 5A and taken along the dashed line f1-f2.

FIG. 5A is a schematic top view illustrating the structure of an OTP memory using a PUF technology according to a third embodiment of the present invention. FIG. 5B is a schematic cross-sectional view illustrating the OTP memory as shown in FIG. 5A and taken along the dashed line f1-f2. In the third embodiment of the present invention, the OTP memory comprises two memory cells $Cell_1$ and $Cell_2$. The two memory cells $Cell_1$ and $Cell_2$ are respectively located beside a first side and a second side of an isolation wall 512. Each of the memory cells $Cell_1$ and $Cell_2$ comprises four forksheet transistors. The memory cell $Cell_1$ comprises a select transistor $M_{S1}$, a select transistor $M_{S2}$, an antifuse transistor $M_{AF1}$ and an antifuse transistor $M_{AF2}$. The memory cell $Cell_2$ comprises a select transistor $M_{S3}$, a select transistor $M_{S4}$, an antifuse transistor $M_{AF3}$ and an antifuse transistor $M_{AF4}$. These transistors are forksheet transistors. The structure of each of these transistors is similar to the structure of the forksheet transistor shown in FIG. 1A and not redundantly described herein. In addition, each of these transistors comprises plural nanowires.

As shown in FIGS. 5A and 5B, the select transistor $M_{S1}$ comprises the drain/source structure 507, a drain/source structure 509, a gate structure and plural nanowires 641, 642. The first-portion surfaces of the nanowires 641 and 642 are contacted with the isolation wall 512, and the second-portion surfaces of the nanowires 641 and 642 are contacted with the gate structure. The gate structure comprises two gate dielectric layers 640 and 643, a gate layer 649 and two spacers 647 and 648. The central region of the second-portion surface of the nanowire 641 is covered by the gate dielectric layer 640. The central region of the second-portion surface of the nanowire 642 is covered by the gate dielectric layer 643. The two gate dielectric layers 640 and 643 are covered by the gate layer 649. The first side regions of the second-portion surfaces of the nanowires 641 and 642 are contacted with the spacer 647 and supported by the spacer 647. The second side regions of the second-portion surfaces of the nanowires 641 and 642 are contacted with the spacer 648 and supported by the spacer 648. The drain/source structure 507 is electrically contacted with the first terminals of the nanowires 641 and 642. The drain/source structure 509 is electrically contacted with the second terminals of the nanowires 641 and 642. The drain/source structure 509 is electrically connected with the bit line $BL_1$. The gate layer 649 is connected with the word line $WL_1$.

As shown in FIGS. 5A and 5B, the antifuse transistor $M_{AF1}$ comprises a drain/source structure 505, a drain/source structure 507, a gate structure and plural nanowires 541, 542. The first-portion surfaces of the nanowires 541 and 542 are contacted with the isolation wall 512, and the second-portion surfaces of the nanowires 541 and 542 are contacted with the gate structure. The gate structure comprises two gate dielectric layers 540 and 543, a gate layer 549 and two spacers 547, 548. The central region of the second-portion surface of the nanowire 541 is covered by the gate dielectric layer 540. The central region of the second-portion surface of the nanowire 542 is covered by the gate dielectric layer 543. The two gate dielectric layers 540 and 543 are covered by the gate layer 549. The first side regions of the second-portion surfaces of the nanowires 541 and 542 are contacted with the spacer 547 and supported by the spacer 547. The second side regions of the second-portion surfaces of the nanowires 541 and 542 are contacted with the spacer 548 and supported by the spacer 548. The drain/source structure 505 is electrically contacted with the first terminal of the nanowires 541 and 542. The drain/source structure 507 is electrically contacted with the second terminals of the nanowires 541 and 542. The gate layer 549 is electrically connected with an antifuse line $AF_1$.

As shown in FIGS. 5A and 5B, the antifuse transistor $M_{AF2}$ comprises a drain/source structure 503, the drain/source structure 505, a gate structure and plural nanowires 531, 532. The first-portion surfaces of the nanowires 531 and 532 are contacted with the isolation wall 512, and the second-portion surfaces of the nanowires 531 and 532 are contacted with the gate structure. The gate structure comprises two gate dielectric layers 530 and 533, a gate layer 539 and two spacers 537, 538. The central region of the second-portion surface of the nanowire 531 is covered by the gate dielectric layer 530. The central region of the second-portion surface of the nanowire 532 is covered by the gate dielectric layer 533. The two gate dielectric layers 530 and 533 are covered by the gate layer 539. The first side regions of the second-portion surfaces of the nanowires 531 and 532 are contacted with the spacer 537 and supported by the spacer 537. The second side regions of the second-portion surfaces of the nanowires 531 and 532 are contacted with the spacer 538 and supported by the spacer 538. The drain/source structure 503 is electrically contacted with the first terminals of the nanowires 531 and 532. The drain/source structure 505 is electrically contacted with the second terminals of the nanowires 531 and 532. The gate layer 539 is electrically connected with an antifuse line $AF_2$.

As shown in FIGS. 5A and 5B, the select transistor $M_{S2}$ comprises a drain/source structure 501, the drain/source structure 503, a gate structure and plural nanowires 521, 522. The first-portion surfaces of the nanowires 521 and 522 are contacted with the isolation wall 512, and the second-portion surfaces of the nanowires 521 and 522 are contacted with the gate structure. The gate structure comprises two gate dielectric layers 520 and 523, a gate layer 529 and two spacers 527, 528. The central region of the second-portion surface of the nanowire 521 is covered by the gate dielectric layer 520. The central region of the second-portion surface of the nanowire 522 is covered by the gate dielectric layer 523. The two gate dielectric layers 520 and 523 are covered by the gate layer 529. The first side regions of the second-portion surfaces of the nanowires 521 and 522 are contacted with the spacer 527 and supported by the spacer 527. The second side regions of the second-portion surfaces of the nanowires 521 and 522 are contacted with the spacer 528 and supported by the spacer 528. The drain/source structure 501 is electrically contacted with the first terminals of the nanowires 521 and 522. The drain/source structure 503 is electrically contacted with the second terminals of the nanowires 521 and 522. Moreover, the drain/source structure 501 is electrically connected with a bit line $BL_2$, and the gate layer 529 is electrically connected with a word line $WL_2$.

As shown in FIG. 5B, the nanowires 641, 541, 531 and 521 of the select transistor $M_{S1}$, the antifuse transistor $M_{AF1}$, the antifuse transistor $M_{AF2}$ and the select transistor $M_{S2}$ are electrically connected with each other through the drain/source structures 503, 505 and 507. In a variant example, a long nanowire structure is provided, and the nanowire structure is divided into four parts. The first part of the nanowire structure is served as the nanowire 641 of the select transistor $M_{S1}$. The second part of the nanowire structure is served as the nanowire 541 of the antifuse transistor $M_{AF1}$. The third part of the nanowire structure is served as the nanowire 531 of the antifuse transistor $M_{AF2}$. The fourth part of the nanowire structure is served as the nanowire 521 of the select transistor $M_{S2}$. That is, the nanowires 641, 541 531 and 521 are integrally formed. Similarly, the nanowires 642, 542, 532 and 522 are integrally formed.

The structure of the memory cell $Cell_2$ is similar to the structure of the memory cell $Cell_1$. For succinctness, only the structures of the select transistor $M_{S3}$, the select transistor $M_{S4}$, the antifuse transistor $M_{AF3}$ and the antifuse transistor $M_{AF4}$ will be briefly described as follows.

Please refer to FIG. 5A again. The structure of the memory cell $Cell_2$ will be described as follows. The first-portion surfaces of plural nanowires 572, 582, 592 and 692 are contacted with the isolation wall 512. The second-portion surfaces of the nanowires 572, 582, 592 and 692 are respectively contacted with the corresponding gate structures. The central region of the second-portion surface of the nanowire 572 is covered by a gate dielectric layer 573. The gate dielectric layer 573 is covered by the gate layer 529. The first side region of the second-portion region of the nanowire 572 is contacted with the spacer 527. The second side region of the second-portion surface of the nanowire 572 is contacted with the spacer 528. The central region of the second-portion surface of the nanowire 582 is covered by a gate dielectric layer 583. The gate dielectric layer 583 is covered by the gate layer 539. The first side region of the second-portion surface of the nanowire 582 is contacted with the spacer 537. The second side region of the second-portion surface of the nanowire 582 is contacted with the spacer 538. The central region of the second-portion surface of the nanowire 592 is covered by a gate dielectric layer 593. The gate dielectric layer 593 is covered by the gate layer 549. The first side region of the second-portion surface of the nanowire 592 is contacted with the spacer 547. The second side region of the second-portion surface of the nanowire 592 is contacted with the spacer 548. The central region of the second-portion surface of the nanowire 692 is covered by the gate dielectric layer 693. The gate dielectric layer 693 is covered by the gate layer 649. The first side region of the second-portion surface of the nanowire 692 is contacted with the spacer 647. The second side region of the second-portion surface of the nanowire 692 is contacted with the spacer 648.

A drain/source structure 551 is electrically connected with a bit line $BL_4$. In addition, the drain/source structure 551 is electrically connected with the first terminal of the nanowire 572. A drain/source structure 553 is electrically connected with the second terminal of the nanowire 572 and the first terminal of the nanowire 582. A drain/source terminal 555 is electrically connected with the second terminal of the nanowire 582 and the first terminal of the nanowire 592. A drain/source structure 557 is electrically connected with the second terminal of the nanowire 592 and the first terminal of the nanowire 692. In addition, the drain/source structure 559 is electrically connected with the second terminal of the nanowire 692 and a bit line $BL_3$.

In the third embodiment, each of the memory cell $Cell_1$ and $Cell_2$ includes two enroll paths and two read paths. Take the memory cell $Cell_1$ for example. When the enroll action is performed, the region between the antifuse line $AF_1$ and the bit line $BL_1$ is the first enroll path, and the region between the antifuse line $AF_2$ and the bit line $BL_2$ is the second enroll path. When the read action is performed, the region between the antifuse line $AF_1$ and the bit line $BL_1$ is the first read path, and the region between the antifuse line $AF_2$ and the bit line $BL_2$ is the second read path.

Figures 6A, 6B:
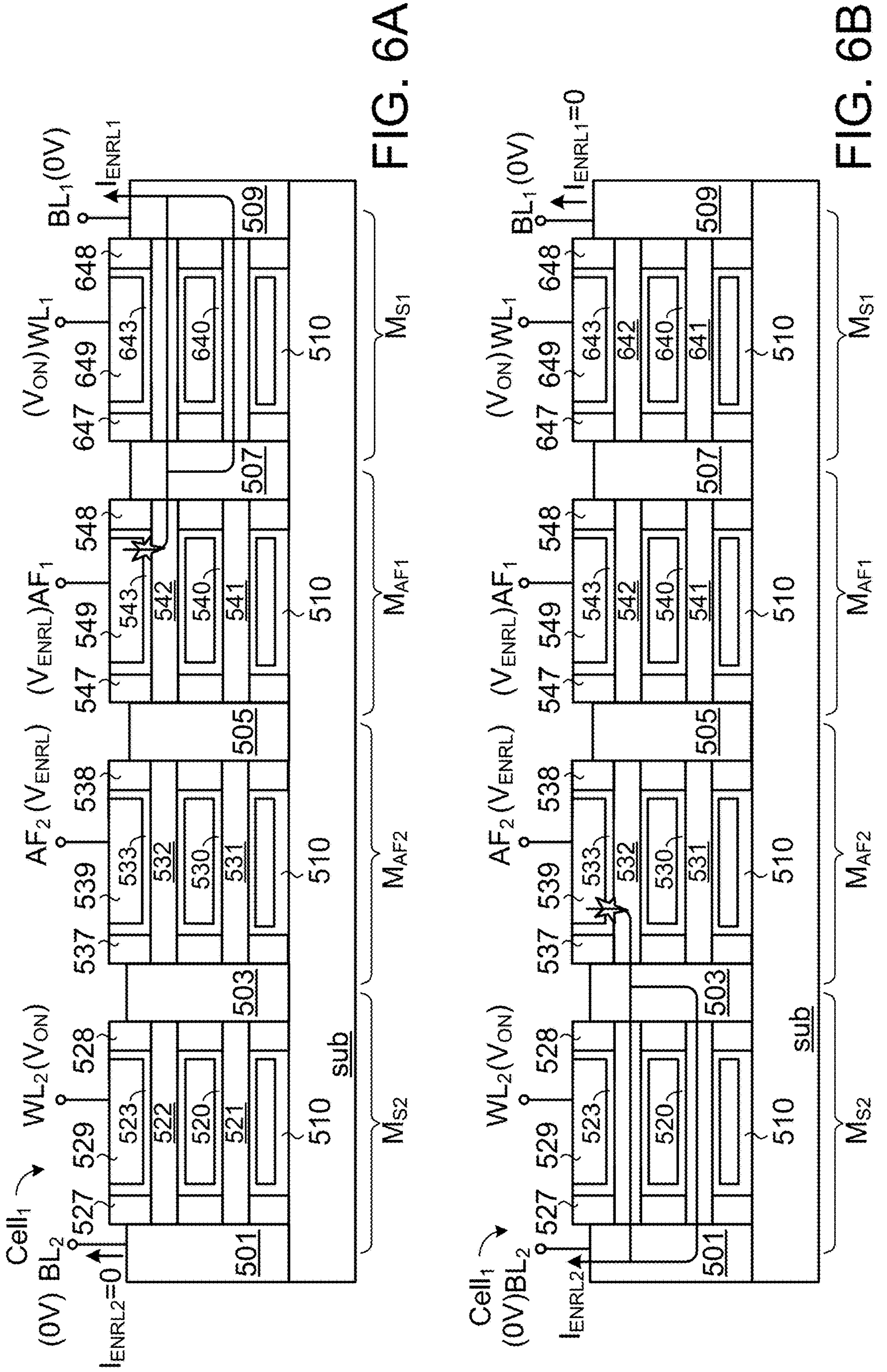
FIG. 6A and FIG. 6B schematically illustrate associated bias voltages for performing an enroll action on the OTP memory according to the third embodiment of the present invention.
Figures 6C, 6D:
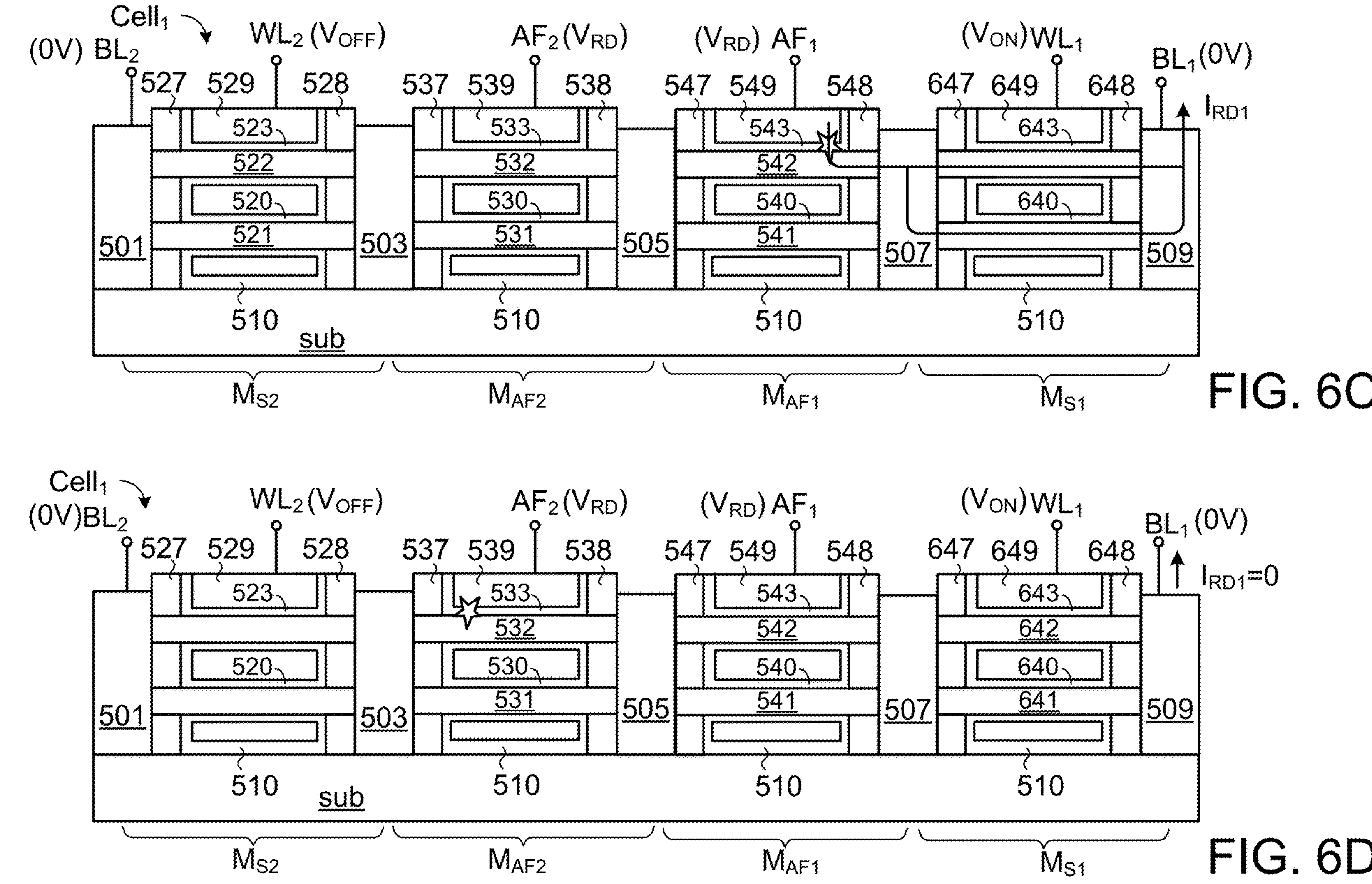
FIG. 6C and FIG. 6D schematically illustrate associated bias voltages for performing a read action on the OTP memory according to the third embodiment of the present invention.

FIG. 6A and FIG. 6B schematically illustrate associated bias voltages for performing an enroll action on the OTP memory according to the third embodiment of the present invention. FIG. 6C and FIG. 6D schematically illustrate associated bias voltages for performing a read action on the OTP memory according to the third embodiment of the present invention. Generally, the two memory cells $Cell_1$ and $Cell_2$ of the OTP memory can be subjected to the enroll action or the read action simultaneously. For succinctness, only the enroll action and the read action performed on the memory cell $Cell_1$ will be described as follows.

In the memory cell $Cell_1$, the region between the antifuse line $AF_1$ and the bit line $BL_1$ is a first enroll path, and the region between the antifuse line $AF_2$ and the bit line $BL_2$ is a second enroll path. When the select transistor $M_{S1}$ and the select transistor $M_{S2}$ are turned on, the first enroll path and the second enroll path are turned on. Consequently, the enroll action can be performed.

Please refer to FIG. 6A and FIG. 6B. When the enroll action is performed, the bit line $BL_1$ and the bit line $BL_2$ receive a ground voltage (0V), the word line $WL_1$ and the word line $WL_2$ receive an on voltage $V_{ON}$, and the antifuse line $AF_1$ and the antifuse line $AF_2$ receive an enroll voltage $V_{ENRL}$. For example, the enroll voltage $V_{ENRL}$ is in the range between 3V and 6V, and the on voltage $V_{ON}$ is in the range between 0.4V and 3V. Under this circumstance, the select transistor $M_{S1}$ and the select transistor $M_{S2}$ are turned on. That is, the first enroll path and the second enroll path are turned on. Moreover, if the bit line $BL_3$ and the bit line $BL_4$ of the OTP memory receive the ground voltage (0V), the two enroll paths of the memory cell $Cell_2$ are also turned on. That is, the memory cells $Cell_1$ and $Cell_2$ are subjected to the enroll action simultaneously.

In the first enroll path, the select transistor $M_{S1}$ is turned on. Consequently, the ground voltage (0V) of the bit line $BL_1$ is transmitted to the drain/source structure 507 and the nanowires 541 and 542 of the antifuse transistor $M_{AF1}$ through the select transistor $M_{S1}$. In the second enroll path, the select transistor $M_{S2}$ is turned on. Consequently, the ground voltage (0V) of the bit line $BL_2$ is transmitted to the drain/source structure 503 and the nanowires 531 and 532 of the antifuse transistor $M_{AF2}$ through the select transistor $M_{S2}$. Consequently, when the antifuse line $AF_1$ and the antifuse line $AF_2$ receive the enroll voltage $V_{ENRL}$, the voltage stress between the nanowires 541 and 542 and the gate layer 549 of the antifuse transistor $M_{AF1}$ is equal to the enroll voltage $V_{ENRL}$, and the voltage stress between the nanowires 531 and 532 and the gate layer 539 of the antifuse transistor $M_{AF2}$ is equal to the enroll voltage $V_{ENRL}$. Under this circumstance, one of the gate dielectric layers 530, 533, 540 and 543 is ruptured.

Due to the process variation of the memory cell $Cell_1$, it is unable to predict which of the gate dielectric layers 530, 533, 540 and 543 of the antifuse transistor $M_{AF1}$ and $M_{AF2}$ is ruptured when the enroll action is performed. Consequently, the PUF technology can be applied to the memory cell of the third embodiment.

For example, in the memory cell $Cell_1$ as shown in FIG. 6A, the gate dielectric layer 543 of the antifuse transistor $M_{AF1}$ is ruptured after the enroll action is completed. Consequently, a larger enroll current $I_{ENRL1}$ is generated. The enroll current $I_{ENRL1}$ flows from the antifuse line $AF_1$ to the bit line $BL_1$ through the gate layer 549, the gate dielectric layer 543, the nanowire 542, the drain/source structure 507 and the select transistor $M_{S1}$. Since the gate dielectric layer 543 is ruptured, the region between the gate layer 549 and the nanowire 542 has a low resistance value. Moreover, since the gate dielectric layers 530 and 533 of the antifuse transistor $M_{AF2}$ are not ruptured, the enroll current in the bit line $BL_2$ is zero ($I_{ENRL}2=0$). Similarly, if the gate dielectric layer 540 of the antifuse transistor $M_{AF1}$ is ruptured, the larger enroll current $I_{ENRL1}$ is generated in the bit line $BL_1$.

Alternatively, in the memory cell $Cell_1$ as shown in FIG. 6B, the gate dielectric layer 533 of the antifuse transistor $M_{AF2}$ is ruptured after the enroll action is completed. Consequently, a larger enroll current $I_{ENRL2}$ is generated. The enroll current $I_{ENRL2}$ flows from the antifuse line $AF_2$ to the bit line $BL_2$ through the gate layer 539, the gate dielectric layer 533, the nanowire 532, the drain/source structure 503 and the select transistor $M_{S2}$. Since the gate dielectric layer 533 is ruptured, the region between the gate layer 539 and the nanowire 532 has a low resistance value. Moreover, since the gate dielectric layers 540 and 543 of the antifuse transistor $M_{AF1}$ are not ruptured, the enroll current in the bit line $BL_1$ is zero ($I_{ENRL}1=0$). Similarly, if the gate dielectric layer 530 of the antifuse transistor $M_{AF2}$ is ruptured, the larger enroll current $I_{ENRL2}$ is generated in the bit line $BL_2$.

When the read action is performed, one read path is turned on or the two read paths are simultaneously turned on to obtain a one-bit random code. An example of turning on the first read path to obtain the one-bit random code will be described as follows.

Please refer to FIG. 6C and FIG. 6D. When the read action is performed, the bit line $BL_1$ and the bit line $BL_2$ receive the ground voltage (0V), the word line $WL_1$ receives the on voltage $V_{ON}$, the word line $WL_2$ receives an off voltage $V_{OFF}$, and the antifuse line $AF_1$ and the antifuse line $AF_2$ receive an read voltage $V_{RD}$. For example, the read voltage $V_{RD}$ is in the range between 0.75V and 1.2V, and the off voltage $V_{OFF}$ is 0V. Under this circumstance, the select transistor $M_{S1}$ is turned on. That is, the first read path is turned on. In addition, the select transistor $M_{S2}$ is turned off. That is, the second read path is turned off.

Moreover, if the bit line $BL_3$ of the OTP memory receives the ground voltage (0V), the first read path of the memory cell $Cell_2$ is also turned on. That is, the memory cells $Cell_1$ and $Cell_2$ are subjected to the read action simultaneously.

As shown in FIG. 6C, the gate dielectric layer 543 of the antifuse transistor $M_{AF1}$ is ruptured, and the region between the nanowire 542 and the gate layer 549 has the low resistance value. Under this circumstance, the read path of the memory cell $Cell_1$ generates a higher read current $I_{RD}$. The read current $I_{RD}$ flows from the antifuse line $AF_1$ to the bit line $BL_1$ through the gate layer 549, the gate dielectric layer 543, the nanowire 542, the drain/source structure 507 and the select transistor $M_{S1}$.

As shown in FIG. 6D, the gate dielectric layer 533 of the antifuse transistor $M_{AF2}$ is ruptured, and the region between the nanowire 532 and the gate layer 539 has the low resistance value. However, the nanowire 532 is not included in the first read path. Consequently, no read current $I_{RD1}$ is generated by the bit line $BL_1$ of the memory cell $Cell_1$. That is, the magnitude of the read current generated by the bit line $BL_1$ is nearly zero ($I_{RD1}=0$).

As mentioned above, the read action is performed after the enroll action is completed. When the read action is performed, one bit of a random code can be determined according to the magnitude of the read current $I_{RD1}$ in the bit line $BL_1$. For example, a current comparator is provided. The current comparator receives the read current $I_{RD1}$ and a reference current Iref. If the magnitude of the read current $I_{RD1}$ is higher than the magnitude of the reference current Iref, a first logic value (e.g., "0") is determined as the random code. Whereas, if the magnitude of the read current $I_{RD1}$ is lower than the magnitude of the reference current Iref, a second logic value (e.g., "1") is determined as the random code.

Similarly, when the read action is performed, it is feasible to turn on the second read path only. Consequently, one bit of a random code can be determined according to the magnitude of the read current in the bit line $BL_2$.

When the read action is performed, the first read path and the second read path can be turned on simultaneously. By comparing the magnitudes of the currents from the bit lines $BL_1$ and $BL_2$, the current comparator determines one bit of the random code. For example, If the magnitude of the read current $I_{RD1}$ from the bit line $BL_1$ is higher than the magnitude of the read current $I_{RD2}$ from the bit line $BL_2$, a first logic value (e.g., "O") is determined as the random code. Whereas, If the magnitude of the read current $I_{RD1}$ from the bit line $BL_1$ is lower than the magnitude of the read current $I_{RD2}$ from the bit line $BL_2$, a second logic value (e.g., "1") is determined as the random code.

In the memory cell $Cell_1$ of the third embodiment, each of the select transistor $M_{S1}$, the select transistor $M_{S2}$, the antifuse transistor $M_{AF1}$ and the antifuse transistor $M_{AF2}$ has two nanowires. It is noted that numerous modifications and alterations may be made while retaining the teachings of the invention. For example, in some other embodiments, the select transistor $M_{S1}$ has X nanowires, the select transistor $M_{S2}$ has Y nanowires, the antifuse transistor $M_{AF1}$ has Z nanowires, and the antifuse transistor $M_{AF2}$ has W nanowires. W, X, Y, Z are all positive integers, W is greater than or equal to 1, X is greater than or equal to 1, Y is greater than or equal to 1, and Z is greater than or equal to 1. After the enroll action is completed, the read action is performed. When the read action is performed, one bit of the random code is determined according to the ruptured gate dielectric layer in the antifuse transistors $M_{AF1}$ and $M_{AF2}$.

For example, in a variant example of the memory cell of the third embodiment, the select transistor $M_{S1}$ has 1 nanowire (X=1), the select transistor $M_{S2}$ has 1 nanowire (Y=1), the antifuse transistor $M_{AF1}$ has 1 nanowire (Z=1), and the antifuse transistor $M_{AF2}$ has 1 nanowire (W=1). Due to this structural design, the memory cell using the PUF technology has the smallest size.

Figures 7A, 7B:
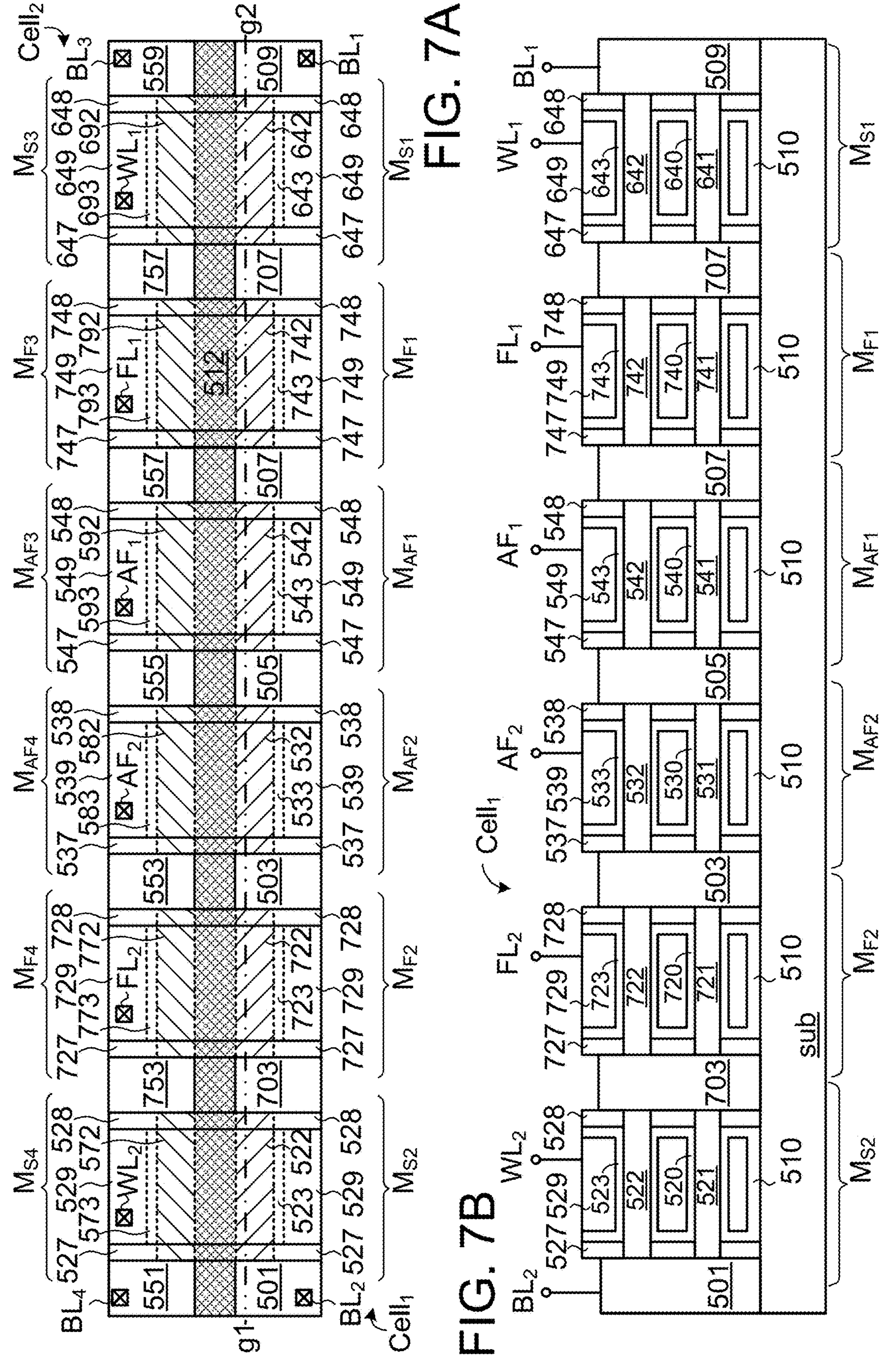
FIG. 7A is a schematic top view illustrating the structure of an OTP memory using a PUF technology according to a fourth embodiment of the present invention.
FIG. 7B is a schematic cross-sectional view illustrating the OTP memory as shown in FIG. 7A and taken along the dashed line g1-g2.

FIG. 7A is a schematic top view illustrating the structure of an OTP memory using a PUF technology according to a fourth embodiment of the present invention. FIG. 7B is a schematic cross-sectional view illustrating the OTP memory as shown in FIG. 7A and taken along the dashed line g1-g2. In the fourth embodiment of the present invention, the OTP memory comprises two memory cells $Cell_1$ and $Cell_2$. The two memory cells $Cell_1$ and $Cell_2$ are respectively located beside a first side and a second side of an isolation wall 512. Each of the memory cells $Cell_1$ and $Cell_2$ comprises six forksheet transistors. The memory cell $Cell_1$ comprises a select transistor $M_{S1}$, a following transistor $M_{F1}$, a select transistor $M_{S2}$, a following transistor $M_{F2}$, an antifuse transistor $M_{AF1}$ and an antifuse transistor $M_{AF2}$. The memory cell $Cell_2$ comprises a select transistor $M_{S3}$, a following transistor $M_{F3}$, a select transistor $M_{S4}$, a following transistor $M_{F4}$, an antifuse transistor $M_{AF3}$ and an antifuse transistor $M_{AF4}$. These transistors are forksheet transistors. The structure of each of these transistors is similar to the structure of the forksheet transistor shown in FIG. 1A, and not redundantly described herein. In addition, each of these transistors comprises plural nanowires.

In comparison with the memory cell of the third embodiment, the memory cell of the fourth embodiment comprises two following transistors. In the memory cell $Cell_1$ as shown in FIG. 5B, the select transistor $M_{S1}$ is directly coupled to the antifuse transistor $M_{AF1}$, and the select transistor $M_{S2}$ is directly coupled to the antifuse transistor $M_{AF2}$. In the memory cell $Cell_1$ of the fourth embodiment, the select transistor $M_{S1}$ is coupled to the antifuse transistor $M_{AF1}$ through the following transistor $M_{F2}$, and the select transistor $M_{S2}$ is coupled to the antifuse transistor $M_{AF2}$ through the following transistor $M_{F1}$. That is, in the memory cell $Cell_1$ of the fourth embodiment, the following transistor $M_{F1}$ is connected between the select transistor $M_{S1}$ and the antifuse transistor $M_{AF1}$, and the following transistor $M_{F2}$ is connected between the select transistor $M_{S2}$ and the antifuse transistor $M_{AF2}$. For succinctness, only the structures of the following transistors $M_{F1}$ and $M_{F2}$ will be described as follows.

As shown in FIGS. 7A and 7B, the following transistor $M_{F1}$ comprises a drain/source structure 507, a drain/source structure 707, a gate structure and plural nanowires 741, 742. The first-portion surfaces of the nanowires 741 and 742 are contacted with the isolation wall 512, and the second-portion surfaces of the nanowires 741 and 742 are contacted with the gate structure. The gate structure comprises two gate dielectric layers 740 and 743, a gate layer 749 and two spacers 747, 748. The central region of the second-portion surface of the nanowire 741 is covered by the gate dielectric layer 740. The central region of the second-portion surface of the nanowire 742 is covered by the gate dielectric layer 743. The two gate dielectric layers 740 and 743 are covered by the gate layer 749. The first side regions of the second-portion surfaces of the nanowires 741 and 742 are contacted with the spacer 747 and supported by the spacer 747. The second side regions of the second-portion surfaces of the nanowires 741 and 742 are contacted with the spacer 748 and supported by the spacer 748. The drain/source structure 507 is electrically contacted with the first terminals of the nanowires 741 and 742. The drain/source structure 707 is electrically contacted with the second terminals of the nanowires 741 and 742. The gate layer 749 is electrically connected with a following line $FL_1$, and the drain/source structure 707 is electrically connected with the nanowires 641 and 642 of the select transistor $M_{S1}$.

As shown in FIGS. 7A and 7B, the following transistor $M_{F2}$ comprises a drain/source structure 703, the drain/source structure 503, a gate structure and plural nanowires 721, 722. The first-portion surfaces of the nanowires 721 and 722 are contacted with the isolation wall 512, and the second-portion surfaces of the nanowires 721 and 722 are contacted with the gate structure. The gate structure comprises two gate dielectric layers 720 and 723, a gate layer 729 and two spacers 727, 728. The central region of the second-portion surface of the nanowire 721 is covered by the gate dielectric layer 720. The central region of the second-portion surface of the nanowire 722 is covered by the gate dielectric layer 723. The two gate dielectric layers 720 and 723 are covered by the gate layer 729. The first side regions of the second-portion surfaces of the nanowires 721 and 722 are contacted with the spacer 727 and supported by the spacer 727. The second side regions of the second-portion surfaces of the nanowires 721 and 722 are contacted with the spacer 728 and supported by the spacer 728. The drain/source structure 703 is electrically contacted with the first terminals of the nanowires 721 and 722. The drain/source structure 503 is electrically contacted with the second terminals of the nanowires 721 and 722. The gate layer 729 is electrically connected with a following line $FL_2$. In addition, the drain/source structure 503 is electrically connected with the nanowires 531 and 532 of the antifuse transistor $M_{AF2}$.

As shown in FIG. 7A, the structure of the memory cell $Cell_2$ is similar to the structure of the memory cell $Cell_1$. For succinctness, only the structures of the following transistors $M_{F3}$ and $M_{F4}$ will be described as follows.

Please refer to FIG. 7A again. The structures of the following transistors $M_{F3}$ and $M_{F4}$ in the memory cell $Cell_2$ will be described as follows. The first-portion surfaces of plural nanowires 772 and 792 are contacted with the isolation wall 512. The second-portion surfaces of the nanowires 772 and 792 are respectively contacted with the corresponding gate structures. The central region of the second-portion surface of the nanowire 772 is covered by a gate dielectric layer 773. The gate dielectric layer 773 is covered by the gate layer 729. The first side region of the second-portion region of the nanowire 772 is contacted with the spacer 727. The second side region of the second-portion surface of the nanowire 772 is contacted with the spacer 728. The central region of the second-portion surface of the nanowire 792 is covered by a gate dielectric layer 793. The gate dielectric layer 793 is covered by the gate layer 749. The first side region of the second-portion surface of the nanowire 792 is contacted with the spacer 747. The second side region of the second-portion surface of the nanowire 792 is contacted with the spacer 748.

A drain/source structure 753 is electrically connected with the first terminal of the nanowire 772 and the second terminal of the nanowire 572. A drain/source structure 553 is electrically connected with the second terminal of the nanowire 772 and the first terminal of the nanowire 582. A drain/source terminal 557 is electrically connected with the second terminal of the nanowire 592 and the first terminal of the nanowire 792. A drain/source structure 757 is electrically connected with the second terminal of the nanowire 792 and the first terminal of the nanowire 692.

As mentioned above, the present invention provides an OTP memory using the PUF technology. The OTP memory comprises two memory cells $Cell_1$ and $Cell_2$, which are respectively located beside the first side and the second side of the isolation wall 512. Take the memory cell $Cell_1$ for example. When the enroll action is performed, the region between the antifuse line $AF_1$ and the bit line $BL_1$ is the first enroll path, and the region between the antifuse line $AF_2$ and the bit line $BL_2$ is the second enroll path. When the read action is performed, the region between the antifuse line $AF_1$ and the bit line $BL_1$ is the first read path, and the region between the antifuse line $AF_2$ and the bit line $BL_2$ is the second read path. When the two enroll paths are turned on, the enroll action is performed on the memory cell $Cell_1$. When one read path is turned on or two read paths are turned on, the read action is performed on the memory cell $Cell_1$. Consequently, one bit of a random code can be determined.

When the enroll action or the read action is performed, the bias voltages provided to the antifuse line $AF_1$, the antifuse line $AF_2$, the bit line $BL_1$ and the bit line $BL_2$ may be referred to the bias voltages of the third embodiment, and not redundantly described herein.

When the enroll action is performed on the memory cell $Cell_1$, an on voltage $V_{ON1}$ is provided to the word line $WL_1$ and the word line $WL_2$, and an on voltage $V_{ON2}$ is provided to the following line $FL_1$ and the following line $FL_2$. Consequently, the two enroll paths are turned on. For example, the on voltage $V_{ON1}$ is in the range between 0.4V and 3V, and the on voltage $V_{ON2}$ is in the range between 0.4V and 3V. It is noted that the magnitude of the on voltage $V_{ON1}$ and the magnitude of the on voltage $V_{ON2}$ may be identical or different.

When the read action is performed on the memory cell $Cell_1$, the on voltage $V_{ON1}$ is provided to the word line $WL_1$, and the on voltage $V_{ON2}$ is provided to the following line $FL_1$. Consequently, the first read path is turned on. In addition, the off voltage $V_{OFF}$ is provided to the word line $WL_2$ and the following line $FL_2$. Consequently, the second read path is turned off. According to the magnitude of the read current in the first read path, a one-bit random code is obtained.

Alternatively, when the read action is performed on the memory cell $Cell_1$, the first read path and the second read path are turned on simultaneously. According to the magnitudes of the two read currents in the first read path and the second read path, one-bit random code is obtained.

In the memory cell $Cell_1$ of the fourth embodiment, each of the select transistor $M_{S1}$, the select transistor $M_{S2}$, the following transistor $M_{F1}$, the following transistor $M_{F2}$, the antifuse transistor $M_{AF1}$ and the antifuse transistor $M_{AF2}$ has two nanowires. It is noted that numerous modifications and alterations may be made while retaining the teachings of the invention. For example, in some other embodiments, the select transistor $M_{S1}$ has X nanowires, the select transistor $M_{S2}$ has Y nanowires, the antifuse transistor $M_{AF1}$ has Z nanowires, the antifuse transistor $M_{AF2}$ has W nanowires, the following transistor $M_{F1}$ has V nanowires, and the following transistor $M_{F2}$ has U nanowires. U, V, W, X, Y, Z are all positive integers, U is greater than or equal to 1, V is greater than or equal to 1, W is greater than or equal to 1, X is greater than or equal to 1, Y is greater than or equal to 1, and Z is greater than or equal to 1.

For example, in a variant example of the memory cell of the fourth embodiment, the select transistor $M_{S1}$ has 1 nanowire (X=1), the select transistor $M_{S2}$ has 1 nanowire (Y=1), the following transistor $M_{F1}$ has 1 nanowire (V=1), the following transistor $M_{F2}$ has 1 nanowire (U=1), the antifuse transistor $M_{AF1}$ has 1 nanowire (Z=1), and the antifuse transistor $M_{AF2}$ has 1 nanowire (W=1). Due to this structural design, the memory cell using the PUF technology has the smallest size.

From the above descriptions, the present invention provides a one time programming memory with forksheet transistors by using a physically unclonable function (PUF) technology. Each memory cell of the one time programming memory can generate one bit of the random code. Moreover, plural memory cells can be used to generate a unique identity code (ID code) of the semiconductor chip. For example, after 128 memory cells are subjected to an enroll action and a read action sequentially, a 128-bit random code can be generated. By using the 128-bit random code, the data in the semiconductor chip can be effectively protected.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A one time programming memory using a physically unclonable function technology, the one time programming memory comprising a first memory cell and a second memory cell, the first memory cell and the second memory cell being respectively located beside a first side and a second side of an isolation wall, the first memory cell comprising:

a first nanowire, wherein a first-portion surface of the first nanowire is contacted with the isolation wall;

a second nanowire, wherein a first-portion surface of the second nanowire is contacted with the isolation wall;

a first gate structure comprising a first gate dielectric layer, a second gate dielectric layer, a first gate layer, a first spacer and a second spacer, wherein a central region of a second-portion surface of the first nanowire is covered by the first gate dielectric layer, a central region of a second-portion surface of the second nanowire is covered by the second gate dielectric layer, a first side region of the second-portion surface of the first nanowire is contacted with the first spacer, a second side region of the second-portion surface of the first nanowire is contacted with the second spacer, a first side region of the second-portion surface of the second nanowire is contacted with the first spacer, a second side region of the second-portion surface of the second nanowire is contacted with the second spacer, the first gate dielectric layer and the second gate dielectric layer are covered by the first gate layer, and the first gate layer is connected with an antifuse line;

a first drain/source structure electrically connected with a first terminal of the first nanowire and a first terminal of the second nanowire;

a second drain/source structure electrically connected with a second terminal of the second nanowire, wherein the second drain/source structure is not electrically connected with a second terminal of the first nanowire;

a first select transistor, wherein a first drain/source terminal of the first select transistor is coupled to the first drain/source structure, a gate terminal of the first select transistor is connected with a first word line, and a second drain/source terminal of the first select transistor is connected with a first bit line; and a second select transistor, wherein a first drain/source terminal of the second select transistor is coupled to the second drain/source structure, a gate terminal of the second select transistor is connected with a second word line, and a second drain/source terminal of the second select transistor is connected with a second bit line, wherein the first nanowire, the second nanowire, the first gate structure, the first drain/source structure and the second drain/source structure are collaboratively formed as a first antifuse transistor, wherein a region between the antifuse line and the first bit line is an enroll path, and the first nanowire and the second nanowire are included in the enroll path, wherein a region between the antifuse line and the second bit line is a read path, the second nanowire is included in the read path, and the first nanowire is not included in the read path, wherein when an enroll action is performed, the enroll path is turned on, so that one of the first gate dielectric layer and the second gate dielectric layer in the first antifuse transistor is ruptured, wherein when a read action is performed, the read path is turned on, wherein a one-bit random code is determined according to the ruptured one of the first gate dielectric layer and the second gate dielectric layer in the first antifuse transistor.

2. The one time programming memory as claimed in claim 1, wherein when the enroll action is performed, the antifuse line receives an enroll voltage, the first bit line receives a ground voltage, the first word line receives an on voltage, and the second word line receives an off voltage.

3. The one time programming memory as claimed in claim 1, wherein when the read action is performed, the antifuse line receives a read voltage, the second bit line receives a ground voltage, the first word line receives an off voltage, and the second word line receives an on voltage, so that the second bit line generates a read current, wherein a one-bit random code is determined according to a magnitude of the read current.

4. The one time programming memory as claimed in claim 1, wherein the first select transistor is directly coupled to the first antifuse transistor, and the second select transistor is directly coupled to the first antifuse transistor;

wherein the first select transistor comprises:

a third nanowire, wherein a first-portion surface of the third nanowire is contacted with the isolation wall;

a second gate structure comprising a third gate dielectric layer, a second gate layer, a third spacer and a fourth spacer, wherein a central region of a second-portion surface of the third nanowire is covered by the third gate dielectric layer, a first side region of the second-portion surface of the third nanowire is contacted with the third spacer, a second side region of the second-portion surface of the third nanowire is contacted with the fourth spacer, the third gate dielectric layer is covered by the second gate layer, and the second gate layer is connected with the first word line;

the first drain/source structure electrically connected with a first terminal of the third nanowire; and a third drain/source structure electrically connected with a second terminal of the third nanowire, wherein the third drain/source structure is electrically connected with the first bit line;

wherein the second select transistor comprises:

a fourth nanowire, wherein a first-portion surface of the fourth nanowire is contacted with the isolation wall;

a third gate structure comprising a fourth gate dielectric layer, a third gate layer, a fifth spacer and a sixth spacer, wherein a central region of a second-portion surface of the fourth nanowire is covered by the fourth gate dielectric layer, a first side region of the second-portion surface of the fourth nanowire is contacted with the fifth spacer, a second side region of the second-portion surface of the fourth nanowire is contacted with the sixth spacer, the fourth gate dielectric layer is covered by the third gate layer, and the third gate layer is connected with the second word line;

the second drain/source structure electrically connected with a first terminal of the fourth nanowire; and a fourth drain/source structure electrically connected with a second terminal of the fourth nanowire, wherein the fourth drain/source structure is electrically connected with the second bit line.

5. The one time programming memory as claimed in claim 1, wherein the second memory cell comprises:

a third nanowire, wherein a first-portion surface of the third nanowire is contacted with the isolation wall;

a fourth nanowire, wherein a first-portion surface of the fourth nanowire is contacted with the isolation wall;

a second gate structure comprising a third gate dielectric layer, a fourth gate dielectric layer, the first gate layer, the first spacer and the second spacer, wherein a central region of a second-portion surface of the third nanowire is covered by the third gate dielectric layer, a central region of a second-portion surface of the fourth nanowire is covered by the fourth gate dielectric layer, a first side region of the second-portion surface of the third nanowire is contacted with the first spacer, a second side region of the second-portion surface of the third nanowire is contacted with the second spacer, a first side region of the second-portion surface of the fourth nanowire is contacted with the first spacer, a second side region of the second-portion surface of the fourth nanowire is contacted with the second spacer, and the third gate dielectric layer and the fourth gate dielectric layer are covered by the first gate layer;

a third drain/source structure electrically connected with a first terminal of the third nanowire and a first terminal of the fourth nanowire;

a fourth drain/source structure electrically connected with a second terminal of the fourth nanowire, wherein the fourth drain/source structure is not electrically connected with a second terminal of the third nanowire; and a third select transistor, wherein a first drain/source terminal of the third select transistor is coupled to the third drain/source structure, a gate terminal of the third select transistor is connected with the first word line, and a second drain/source terminal of the third select transistor is connected with a third bit line; and a fourth select transistor, wherein a first drain/source terminal of the fourth select transistor is coupled to the fourth drain/source structure, a gate terminal of the fourth select transistor is connected with the second word line, and a second drain/source terminal of the fourth select transistor is connected with a fourth bit line, wherein the third nanowire, the fourth nanowire, the second gate structure, the third drain/source structure and the fourth drain/source structure are collaboratively formed as a second antifuse transistor.

6. The one time programming memory as claimed in claim 1, wherein the first select transistor is coupled to the first antifuse transistor through a first following transistor;

wherein the first following transistor comprises:

a third nanowire, wherein a first-portion surface of the third nanowire is contacted with the isolation wall;

a second gate structure comprising a third gate dielectric layer, a second gate layer, a third spacer and a fourth spacer, wherein a central region of a second-portion surface of the third nanowire is covered by the third gate dielectric layer, a first side region of the second-portion surface of the third nanowire is contacted with the third spacer, a second side region of the second-portion surface of the third nanowire is contacted with the fourth spacer, the third gate dielectric layer is covered by the second gate layer, and the second gate layer is connected with a first following line;

the first drain/source structure electrically connected with a first terminal of the third nanowire; and a third drain/source structure electrically connected with a second terminal of the third nanowire;

wherein the first select transistor comprises:

a fourth nanowire, wherein a first-portion surface of the fourth nanowire is contacted with the isolation wall;

a third gate structure comprising a fourth gate dielectric layer, a third gate layer, a fifth spacer and a sixth spacer, wherein a central region of a second-portion surface of the fourth nanowire is covered by the fourth gate dielectric layer, a first side region of the second-portion surface of the fourth nanowire is contacted with the fifth spacer, a second side region of the second-portion surface of the fourth nanowire is contacted with the sixth spacer, the fourth gate dielectric layer is covered by the third gate layer, and the third gate layer is connected with the first word line;

the third drain/source structure electrically connected with a first terminal of the fourth nanowire; and a fourth drain/source structure electrically connected with a second terminal of the fourth nanowire, wherein the fourth drain/source structure is electrically connected with the first bit line.

7. The one time programming memory as claimed in claim 6, wherein the second select transistor is coupled to the first antifuse transistor through a second following transistor;

wherein the second following transistor comprises:

a fifth nanowire, wherein a first-portion surface of the fifth nanowire is contacted with the isolation wall;

a fourth gate structure comprising a fifth gate dielectric layer, a fourth gate layer, a seventh spacer and an eighth spacer, wherein a central region of a second-portion surface of the fifth nanowire is covered by the fifth gate dielectric layer, a first side region of the second-portion surface of the fifth nanowire is contacted with the seventh spacer, a second side region of the second-portion surface of the fifth nanowire is contacted with the eighth spacer, the fifth gate dielectric layer is covered by the fourth gate layer, and the fourth gate layer is connected with a second following line;

the second drain/source structure electrically connected with a first terminal of the fifth nanowire; and a fifth drain/source structure electrically connected with a second terminal of the fifth nanowire;

wherein the second select transistor comprises:

a sixth nanowire, wherein a first-portion surface of the sixth nanowire is contacted with the isolation wall;

a fifth gate structure comprising a sixth gate dielectric layer, a fifth gate layer, a ninth spacer and a tenth spacer, wherein a central region of a second-portion surface of the sixth nanowire is covered by the sixth gate dielectric layer, a first side region of the second-portion surface of the sixth nanowire is contacted with the ninth spacer, a second side region of the second-portion surface of the sixth nanowire is contacted with the tenth spacer, the sixth gate dielectric layer is covered by the fifth gate layer, and the fifth gate layer is connected with the second word line;

the fifth drain/source structure electrically connected with a first terminal of the sixth nanowire; and a sixth drain/source structure electrically connected with a second terminal of the sixth nanowire, wherein the sixth drain/source structure is electrically connected with the second bit line.

8. The one time programming memory as claimed in claim 7, wherein when the enroll action is performed, the antifuse line receives an enroll voltage, the first bit line receives a ground voltage, the first word line receives a first on voltage, the first following line receives a second on voltage, and the second word line receives an off voltage.

9. The one time programming memory as claimed in claim 7, wherein when the read action is performed, the antifuse line receives a read voltage, the second bit line receives a ground voltage, the first word line receives an off voltage, the second word line receives a first on voltage, and the second following line receives a second on voltage, so that the second bit line receives a read current, wherein a one-bit random code is determined according to a magnitude of the read current.

10. A one time programming memory using a physically unclonable function technology, the one time programming memory comprising a first memory cell and a second memory cell, the first memory cell and the second memory cell being respectively located beside a first side and a second side of an isolation wall, the first memory cell comprising:

a first nanowire, wherein a first-portion surface of the first nanowire is contacted with the isolation wall;

a first gate structure comprising a first gate dielectric layer, a first gate layer, a first spacer and a second spacer, wherein a central region of a second-portion surface of the first nanowire is covered by the first gate dielectric layer, a first side region of the second-portion surface of the first nanowire is contacted with the first spacer, a second side region of the second-portion surface of the first nanowire is contacted with the second spacer, the first gate dielectric layer is covered by the first gate layer, and the first gate layer is connected with a first antifuse line;

a second nanowire, wherein a first-portion surface of the second nanowire is contacted with the isolation wall;

a second gate structure comprising a second gate dielectric layer, a second gate layer, a third spacer and a fourth spacer, wherein a central region of a second-portion surface of the second nanowire is covered by the second gate dielectric layer, a first side region of the second-portion surface of the second nanowire is contacted with the third spacer, a second side region of the second-portion surface of the second nanowire is contacted with the fourth spacer, the second gate dielectric layer is covered by the second gate layer, and the second gate layer is connected with a second antifuse line;

a first drain/source structure electrically connected with a first terminal of the first nanowire;

a second drain/source structure electrically connected with a second terminal of the first nanowire and a first terminal of the second nanowire; and a third drain/source structure electrically connected with a second terminal of the second nanowire;

a first select transistor, wherein a first drain/source terminal of the first select transistor is coupled to the first drain/source structure, a gate terminal of the first select transistor is connected with a first word line, and a second drain/source terminal of the first select transistor is connected with a first bit line; and a second select transistor, wherein a first drain/source terminal of the second select transistor is coupled to the third drain/source structure, a gate terminal of the second select transistor is connected with a second word line, and a second drain/source terminal of the second select transistor is connected with a second bit line, wherein the first nanowire, the first gate structure, the first drain/source structure and the second drain/source structure are collaboratively formed as a first antifuse transistor, and the second nanowire, the second gate structure, the second drain/source structure and the third drain/source structure are collaboratively formed as a second antifuse transistor, wherein when an enroll action is performed, a region between the first antifuse line and the first bit line is a first enroll path, and a region between the second antifuse line and the second bit line is a second enroll path, wherein when an enroll action is performed, the first enroll path and the second enroll path are turned on, so that one of the first gate dielectric layer and the second gate dielectric layer is ruptured, wherein when a read action is performed, the region between the first antifuse line and the first bit line is a first read path, and the region between the second antifuse line and the second bit line is a second read path, wherein the read action is performed, a one-bit random code is determined.

11. The one time programming memory as claimed in claim 10, wherein when the enroll action is performed, each of the first antifuse line and the second antifuse line receives an enroll voltage, each of the first bit line and the second bit line receives a ground voltage, and each of the first word line and the second word line receives an on voltage.

12. The one time programming memory as claimed in claim 10, wherein when the read action is performed, the first antifuse line receives a read voltage, the first bit line receives a ground voltage, the first word line receives an on voltage, and the second word line receives an off voltage, so that the first bit line generates a read current, wherein a one-bit random code is determined according to a magnitude of the read current.

13. The one time programming memory as claimed in claim 10, wherein when the read action is performed, each of the first antifuse line and the second antifuse line receives a read voltage, each of the first bit line and the second bit line receives a ground voltage, and each of the first word line and the second word line receives an on voltage, so that the first bit line generates a first read current and the second bit line generates a second read current, wherein a one-bit random code is determined according to a magnitude of the first read current and a magnitude of the second read current.

14. The one time programming memory as claimed in claim 10, wherein the first select transistor is directly coupled to the first antifuse transistor, and the second select transistor is directly coupled to the second antifuse transistor;

wherein the first select transistor comprises:

a third nanowire, wherein a first-portion surface of the third nanowire is contacted with the isolation wall;

a third gate structure comprising a third gate dielectric layer, a third gate layer, a fifth spacer and a sixth spacer, wherein a central region of a second-portion surface of the third nanowire is covered by the third gate dielectric layer, a first side region of the second-portion surface of the third nanowire is contacted with the fifth spacer, a second side region of the second-portion surface of the third nanowire is contacted with the sixth spacer, the third gate dielectric layer is covered by the third gate layer, and the third gate layer is connected with the first word line;

the first drain/source structure electrically connected with a first terminal of the third nanowire; and a fourth drain/source structure electrically connected with a second terminal of the third nanowire, wherein the fourth drain/source structure is electrically connected with the first bit line;

wherein the second select transistor comprises:

a fourth nanowire, wherein a first-portion surface of the fourth nanowire is contacted with the isolation wall;

a fourth gate structure comprising a fourth gate dielectric layer, a fourth gate layer, a seventh spacer and an eighth spacer, wherein a central region of a second-portion surface of the fourth nanowire is covered by the fourth gate dielectric layer, a first side region of the second-portion surface of the fourth nanowire is contacted with the seventh spacer, a second side region of the second-portion surface of the fourth nanowire is contacted with the eighth spacer, the fourth gate dielectric layer is covered by the fourth gate layer, and the fourth gate layer is connected with the second word line;

the third drain/source structure electrically connected with a first terminal of the fourth nanowire; and a fifth drain/source structure electrically connected with a second terminal of the fourth nanowire, wherein the fifth drain/source structure is electrically connected with the second bit line.

15. The one time programming memory as claimed in claim 10, wherein the second memory cell comprises:

a third nanowire, wherein a first-portion surface of the third nanowire is contacted with the isolation wall;

a third gate structure comprising a third gate dielectric layer, the first gate layer, the first spacer and the second spacer, wherein a central region of a second-portion surface of the third nanowire is covered by the third gate dielectric layer, a first side region of the second-portion surface of the third nanowire is contacted with the first spacer, a second side region of the second-portion surface of the third nanowire is contacted with the second spacer, the third gate dielectric layer is covered by the first gate layer, and the first gate layer is connected with the first antifuse line;

a fourth nanowire, wherein a first-portion surface of the fourth nanowire is contacted with the isolation wall;

a fourth gate structure comprising a fourth gate dielectric layer, the second gate layer, the third spacer and the fourth spacer, wherein a central region of a second-portion surface of the fourth nanowire is covered by the fourth gate dielectric layer, a first side region of the second-portion surface of the fourth nanowire is contacted with the third spacer, a second side region of the second-portion surface of the fourth nanowire is contacted with the fourth spacer, the fourth gate dielectric layer is covered by the second gate layer, and the second gate layer is connected with the second antifuse line;

a fourth drain/source structure electrically connected with a first terminal of the third nanowire;

a fifth drain/source structure electrically connected with a second terminal of the third nanowire and a first terminal of the fourth nanowire; and a sixth drain/source structure electrically connected with a second terminal of the fourth nanowire;

a third select transistor, wherein a first drain/source terminal of the third select transistor is coupled to the fourth drain/source structure, a gate terminal of the third select transistor is connected with the first word line, and a second drain/source terminal of the third select transistor is connected with a third bit line; and a fourth select transistor, wherein a first drain/source terminal of the fourth select transistor is coupled to the sixth drain/source structure, a gate terminal of the fourth select transistor is connected with the second word line, and a second drain/source terminal of the fourth select transistor is connected with a fourth bit line, wherein the third nanowire, the third gate structure, the fourth drain/source structure and the fifth drain/source structure are collaboratively formed as a third antifuse transistor, and the fourth nanowire, the fourth gate structure, the fifth drain/source structure and the sixth drain/source structure are collaboratively formed as a fourth antifuse transistor.

16. The one time programming memory as claimed in claim 10, wherein the first select transistor is coupled to the first antifuse transistor through a first following transistor, and the second select transistor is coupled to the second antifuse transistor through a second following transistor;

wherein the first following transistor comprises:

a third nanowire, wherein a first-portion surface of the third nanowire is contacted with the isolation wall;

a third gate structure comprising a third gate dielectric layer, a third gate layer, a fifth spacer and a sixth spacer, wherein a central region of a second-portion surface of the third nanowire is covered by the third gate dielectric layer, a first side region of the second-portion surface of the third nanowire is contacted with the fifth spacer, a second side region of the second-portion surface of the third nanowire is contacted with the sixth spacer, the third gate dielectric layer is covered by the third gate layer, and the third gate layer is connected with a first following line;

the first drain/source structure electrically connected with a first terminal of the third nanowire; and a fourth drain/source structure electrically connected with a second terminal of the third nanowire;

wherein the first select transistor comprises:

a fourth nanowire, wherein a first-portion surface of the fourth nanowire is contacted with the isolation wall;

a fourth gate structure comprising a fourth gate dielectric layer, a fourth gate layer, a seventh spacer and an eighth spacer, wherein a central region of a second-portion surface of the fourth nanowire is covered by the fourth gate dielectric layer, a first side region of the second-portion surface of the fourth nanowire is contacted with the seventh spacer, a second side region of the second-portion surface of the fourth nanowire is contacted with the eighth spacer, the fourth gate dielectric layer is covered by the fourth gate layer, and the fourth gate layer is connected with the first word line;

the fourth drain/source structure electrically connected with a first terminal of the fourth nanowire; and a fifth drain/source structure electrically connected with a second terminal of the fourth nanowire, wherein the fifth drain/source structure is electrically connected with the first bit line;

wherein the second following transistor comprises:

a fifth nanowire, wherein a first-portion surface of the fifth nanowire is contacted with the isolation wall;

a fifth gate structure comprising a fifth gate dielectric layer, a fifth gate layer, a ninth spacer and a tenth spacer, wherein a central region of a second-portion surface of the fifth nanowire is covered by the fifth gate dielectric layer, a first side region of the second-portion surface of the fifth nanowire is contacted with the ninth spacer, a second side region of the second-portion surface of the fifth nanowire is contacted with the tenth spacer, the fifth gate dielectric layer is covered by the fifth gate layer, and the fifth gate layer is connected with a second following line;

the third drain/source structure electrically connected with a first terminal of the fifth nanowire; and a sixth drain/source structure electrically connected with a second terminal of the fifth nanowire;

wherein the second select transistor comprises:

a sixth nanowire, wherein a first-portion surface of the sixth nanowire is contacted with the isolation wall;

a sixth gate structure comprising a sixth gate dielectric layer, a sixth gate layer, an eleventh spacer and a twelfth spacer, wherein a central region of a second-portion surface of the sixth nanowire is covered by the sixth gate dielectric layer, a first side region of the second-portion surface of the sixth nanowire is contacted with the eleventh spacer, a second side region of the second-portion surface of the sixth nanowire is contacted with the twelfth spacer, the sixth gate dielectric layer is covered by the sixth gate layer, and the sixth gate layer is connected with the second word line;

the sixth drain/source structure electrically connected with a first terminal of the sixth nanowire; and a seventh drain/source structure electrically connected with a second terminal of the sixth nanowire, wherein the seventh drain/source structure is electrically connected with the second bit line.

17. The one time programming memory as claimed in claim 16, wherein when the enroll action is performed, each of the first antifuse line and the second antifuse line receives an enroll voltage, each of the first bit line and the second bit line receives a ground voltage, each of the first word line and the second word line receives a first on voltage, and each of the first following line and the second following line receives a second on voltage.

18. The one time programming memory as claimed in claim 16, wherein when the read action is performed, the first antifuse line receives a read voltage, the first bit line receives a ground voltage, the first word line receives a first on voltage, the first following line receives a second on voltage, and the second word line receives an off voltage, so that the first bit line generates a read current, wherein a one-bit random code is determined according to a magnitude of the read current.

19. The one time programming memory as claimed in claim 16, wherein when the read action is performed, each of the first antifuse line and the second antifuse line receives a read voltage, each of the first bit line and the second bit line receives a ground voltage, each of the first word line and the second word line receives a first on voltage, and each of the first following line and the second following line receives a second on voltage, so that the first bit line generates a first read current and the second bit line generates a second read current, wherein a one-bit random code is determined according to a magnitude of the first read current and a magnitude of the second read current.

* * * * *